(12) United States Patent
Kim et al.

(10) Patent No.: US 10,627,673 B2
(45) Date of Patent: Apr. 21, 2020

(54) LIGHT EMITTING DIODE ARRAY CONTAINING A MULTILAYER BUS ELECTRODE AND METHOD OF MAKING THE SAME

(71) Applicant: GLO AB, Lund (SE)

(72) Inventors: Brian Kim, Palisades Park, NJ (US); Michael Joseph Cich, Fremont, CA (US); Ansel Saneyuki Reed, Belmont, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/947,575

(22) Filed: Apr. 6, 2018

(65) Prior Publication Data

US 2019/0310514 A1    Oct. 10, 2019

(51) Int. Cl.
*G02F 1/1335* (2006.01)
*H05B 33/08* (2020.01)
(Continued)

(52) U.S. Cl.
CPC ...... *G02F 1/133603* (2013.01); *G02F 1/1343* (2013.01); *H05B 33/0803* (2013.01)

(58) Field of Classification Search
CPC ......... G02F 1/133512; G02F 1/134363; G02F 1/133514; G02F 1/136209;
(Continued)

(56) References Cited

U.S. PATENT DOCUMENTS 8,309,439 B2    11/2012    Seifert et al.
8,664,636 B2    3/2014    Konsek et al.
(Continued)

FOREIGN PATENT DOCUMENTS

KR    1020070025152 A    3/2007
WO    WO2016100657 A1    6/2016

OTHER PUBLICATIONS

Jung, B. O. et al., "Emission Characteristics of InGaN/GaN Core-Shell Nanorods Embedded in a 3D Light-Emitting Diode," Nanoscale Research Letters, vol. 11, No. 215, pp. 1-10, (2016).
(Continued)

*Primary Examiner* — Dong Hui Liang
(74) *Attorney, Agent, or Firm* — The Marbury Law Group PLLC

(57) ABSTRACT

A light emitting device includes a backplane, an array of light emitting diodes attached to a front side of the backplane, a dielectric matrix layer located on the front side of the backplane and laterally surrounding the array of light emitting diodes, a transparent conductive layer contacting a front side surface of light emitting diodes within the array of light emitting diodes, and a patterned bus electrode layer electrically shorted to the transparent conductive layer and including an array of openings therein. Each light emitting diode within the array of light emitting diodes is located within an area of a respective opening through the patterned bus electrode layer. The patterned bus electrode layer can include at least one light-absorptive electrically conductive layer providing light absorption. Alternatively or additionally, the patterned bus electrode layer can include a reflective metal layer.

20 Claims, 27 Drawing Sheets

(51) Int. Cl.
*G02F 1/1343* (2006.01)
*G02F 1/13357* (2006.01)

(58) Field of Classification Search
CPC ......... G02F 2201/121; G02F 2201/123; G02F 2201/40; G02F 2001/136222; G02F 2001/134318; G02F 2001/136218; H01L 51/5284; H01L 27/1288; H01L 27/78633; G09G 3/3648; G09G 3/3655; G09G 2300/0426; G09G 3/32; G09G 3/3233; G09G 3/3225; G09G 3/2092; G09G 3/3208; G02B 5/003; G02B 6/055; G03F 7/0007

See application file for complete search history.

(56) References Cited

U.S. PATENT DOCUMENTS

| | | | |
|---|---|---|---|
| 8,669,574 | B2 | 3/2014 | Konsek et al. |
| 9,281,442 | B2 | 3/2016 | Romano et al. |
| 9,287,443 | B2 | 3/2016 | Konsek et al. |
| 9,595,649 | B2 | 3/2017 | Konsek et al. |
| 9,620,559 | B2 | 4/2017 | Schubert et al. |
| 9,664,636 | B2 | 5/2017 | Wen et al. |
| 9,893,041 | B2 | 2/2018 | Pokhriyal et al. |
| 9,941,262 | B2 | 4/2018 | Thompson |
| 2001/0017677 | A1* | 8/2001 | Kishimoto ............. G02B 5/201 349/106 |
| 2001/0022564 | A1* | 9/2001 | Youngquist .............. G09F 9/33 345/55 |
| 2004/0164312 | A1 | 8/2004 | Biwa et al. |
| 2004/0263441 | A1* | 12/2004 | Tanaka .................. G09G 3/325 345/76 |
| 2005/0077814 | A1* | 4/2005 | Koo ................... H01L 27/3244 313/500 |
| 2007/0077349 | A1* | 4/2007 | Newman ................ B82Y 20/00 427/66 |
| 2008/0218068 | A1* | 9/2008 | Cok .................... H05B 33/145 313/505 |
| 2009/0298278 | A1* | 12/2009 | Tu ....................... B23K 1/0016 438/616 |
| 2011/0143472 | A1 | 6/2011 | Seifert et al. |
| 2011/0254034 | A1 | 10/2011 | Konsek et al. |
| 2011/0266565 | A1* | 11/2011 | Wang .................... G02F 1/1339 257/91 |
| 2012/0234663 | A1* | 9/2012 | Hwang .................. G06F 3/044 200/600 |
| 2012/0280612 | A1* | 11/2012 | Lee ..................... H01L 51/5281 313/504 |
| 2014/0239327 | A1 | 8/2014 | Konsek et al. |
| 2014/0246650 | A1 | 9/2014 | Konsek et al. |
| 2014/0267683 | A1* | 9/2014 | Bibl ........................ H01L 51/50 348/87 |
| 2015/0014648 | A1 | 1/2015 | An |
| 2015/0111329 | A1* | 4/2015 | Wu ..................... H01L 33/0095 438/28 |
| 2015/0177173 | A1 | 6/2015 | Wen et al. |
| 2015/0207028 | A1 | 7/2015 | Romano et al. |
| 2015/0379921 | A1* | 12/2015 | Lee ..................... G09G 3/3208 345/206 |
| 2016/0094160 | A1 | 5/2016 | Golda et al. |
| 2016/0218143 | A1* | 7/2016 | Chaji ................... H01L 27/156 |
| 2016/0351639 | A1 | 12/2016 | Jeong et al. |
| 2017/0227488 | A1 | 8/2017 | Wen et al. |
| 2017/0236811 | A1 | 8/2017 | Pokhriyal et al. |
| 2017/0288102 | A1 | 10/2017 | Farrens et al. |
| 2017/0309223 | A1 | 10/2017 | Deeman et al. |
| 2017/0345969 | A1 | 11/2017 | Romano et al. |
| 2017/0373046 | A1 | 12/2017 | Gardner et al. |
| 2018/0323180 | A1* | 11/2018 | Cok ........................ G09G 3/32 |

OTHER PUBLICATIONS

Cho et al., "A Black Metal-dielectric Thin Film for High-Contrast Displays," Journal of the Korean Physical Society, vol. 55, No. 2, Aug. 2009, pp. 501-507.

"Molybdenum Oxide Sputtering Targets for the Manufacture of Highly Absorbent Functional Layers," www.plansee.com/en/products/thin-film-material/sputtering-targets-and-arcing-cathodes/molybdenum-oxide.html; retrieved Mar. 27, 2018.

Kostenhauer et al., "P-145: Optimization of Molybdenum Oxides for Low-Reflectance Thin Films using Numerical Simulation," SID 2015 Digest, vol. 46, Issue 1, Jun. 2015, p. 1741.

U.S. Appl. No. 15/864,080, filed Jan. 8, 2018, GLO AB.

International Search Report and Written Opinion of the International Searching Authority for International Patent Application No. PCT/US2019/021382, dated Jun. 21, 2019, 9 pages.

* cited by examiner

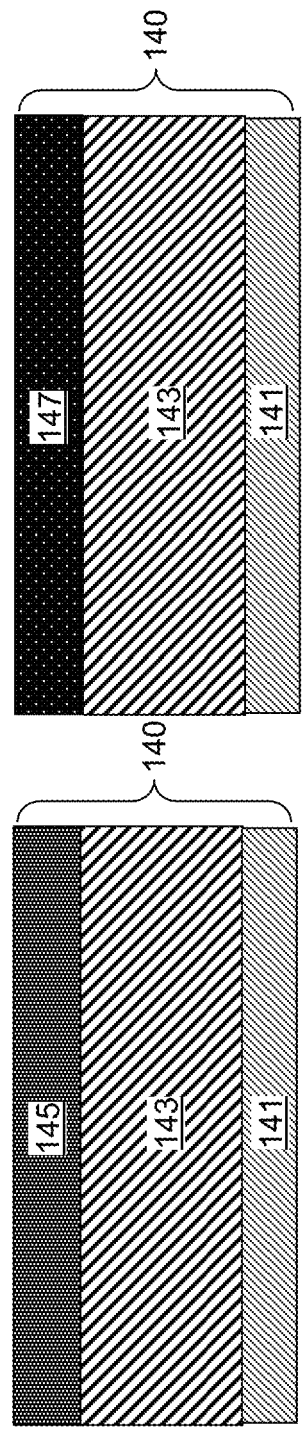

LIGHT EMITTING DIODE ARRAY CONTAINING A MULTILAYER BUS ELECTRODE AND METHOD OF MAKING THE SAME

FIELD

The present invention relates to light emitting devices, and particularly to light emitting diode arrays containing multilayer bus electrodes and methods of fabricating the same.

BACKGROUND

Light emitting devices such as light emitting diodes (LEDs) are used in electronic displays, such as backlights in liquid crystal displays located in laptops or televisions, and LED billboards and microdisplays. Light emitting devices include light emitting diodes (LEDs) and various other types of electronic devices configured to emit light.

SUMMARY

According to an aspect of the present disclosure, a light emitting device is provided, which comprises: a backplane; an array of light emitting diodes attached to a front side of the backplane; a dielectric matrix layer located on the front side of the backplane and laterally surrounding the array of light emitting diodes; a transparent conductive layer contacting front side surfaces of the light emitting diodes; and a patterned bus electrode layer electrically shorted to the transparent conductive layer and including an array of openings therein, wherein each light emitting diode within the array of light emitting diodes is located within an area of a respective opening through the patterned bus electrode layer.

According to another aspect of the present disclosure, a method of forming a light emitting device is provided, which comprises the steps of: attaching an array of light emitting diodes to a front side of a backplane; forming a dielectric matrix layer on the front side of the backplane around the array of light emitting diodes; and forming a combination of a transparent conductive layer and a patterned bus electrode layer over the dielectric matrix layer, wherein: the transparent conductive layer is formed directly on a front side surface of light emitting diodes within the array of light emitting diodes; a patterned bus electrode layer is electrically shorted to the transparent conductive layer and includes an array of openings therein; and each light emitting diode within the array of light emitting diodes is located within an area of a respective opening through the patterned bus electrode layer.

BRIEF DESCRIPTION OF THE DRAWINGS

FIG. 6A is a vertical cross-sectional view of a first exemplary light-absorptive conductive layer according to the first embodiment of the present disclosure.

FIG. 6B is a vertical cross-sectional view of a second exemplary light-absorptive conductive layer according to the first embodiment of the present disclosure.

DETAILED DESCRIPTION

Figure 1A:
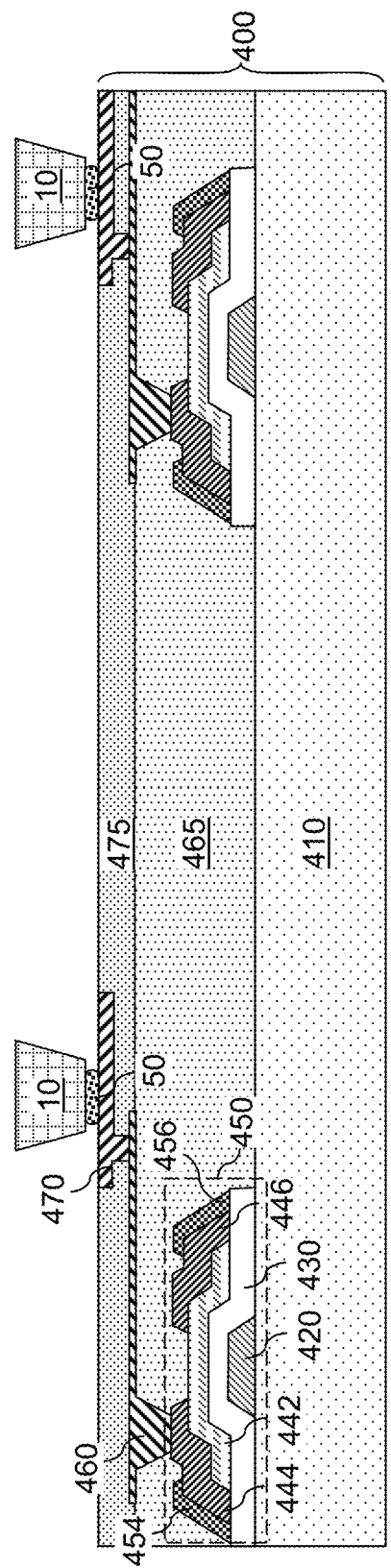
FIG. 1A is a vertical cross-sectional view of a first exemplary structure after forming an array of light emitting diodes on a backplane according to a first embodiment of the present disclosure.

As discussed above, the present disclosure is directed to light emitting diode arrays having multilayer bus electrodes and methods of fabricating the same. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "semiconducting material" refers to a material having electrical conductivity in the range from $1.0 \times 10^{-6}$ S/cm to $1.0 \times 10^5$ S/cm. As used herein, a "metallic material" refers to a conductive material including at least one metallic element therein. All measurements for electrical conductivities are made at the standard condition.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each subpixel is paired with a red emitting planar LED, such as an organic or inorganic red emitting planar LED to form a red emitting subpixel.

Figure 1B:
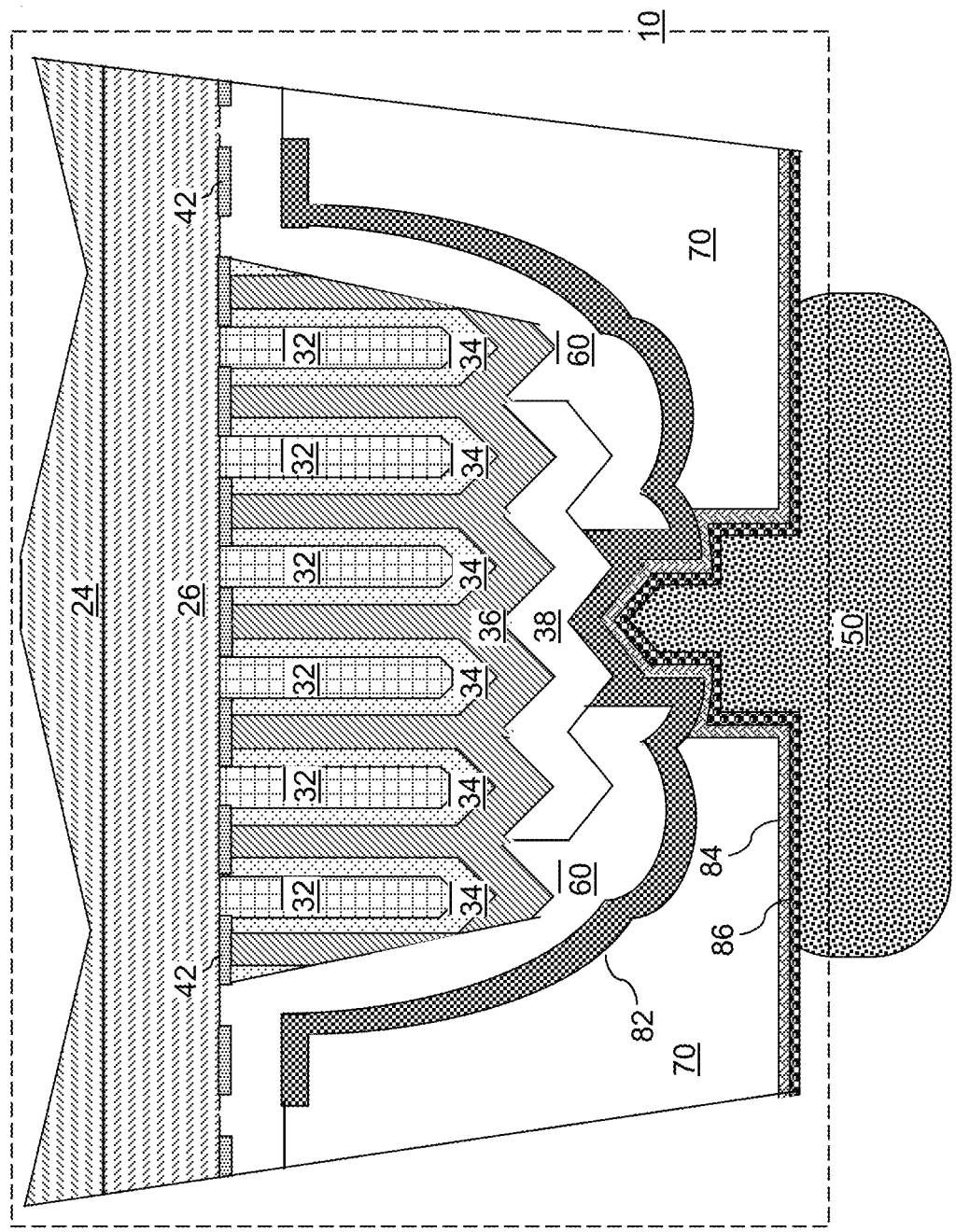
FIG. 1B is a magnified view of a region including a light emitting device within the structure of FIG. 1A.

Referring to FIGS. 1A and 1B, a first exemplary structure according to a first embodiment of the present disclosure includes a backplane 400 and an array of light emitting diodes 10 attached to a front side of the backplane 400 through an array of solder contacts, such as solder layer or solder balls 50. The backplane 400 includes a backplane substrate 410, which can be an insulating substrate. A control circuitry for controlling operation of the light emitting devices 10 attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT 450 is shown in FIG. 1A, other types of TFTs, such as inverted coplanar, top gated staggered and top gated coplanar TFTs can be used instead. Various electrical wirings can be provided to interconnect the various electrical nodes of the field effect transistors to electrical interfaces (not expressly shown) on the backplane 400. Source interconnect wiring 456 and drain interconnect wiring 454 are illustrated. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light emitting diodes 10.

Each light emitting diode 10 can be any diode configured to emit light along a direction away from the backplane 400 and having at least one bonding pad facing the backplane 400. While an exemplary configuration of the light emitting diodes 10 is illustrated in FIG. 1B, it is understood that other configurations for the light emitting diodes 10 can also be employed. A light emitting diode 10 may be formed by sequentially depositing a buffer layer 24 and a doped compound semiconductor layer 26 (such as an n-doped GaN layer) having a doping of a first conductivity type on a transparent single crystalline substrate such as a sapphire substrate. A growth mask layer 42 with arrays of openings can be formed on top of the doped compound semiconductor layer 26. An array of nanowire cores 32 can be grown through the openings in the growth mask layer 42 by a selective epitaxial deposition process. Alternatively, nanopyramids may be grown in lieu of the nanowire cores 32. Methods for growing the nanowires cores 32 through the openings in the patterned growth mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety.

An active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light emitting diode applications provided that it can be grown on the surfaces of the nanowires cores 32. The set of all layers within an active shell 34 is herein referred to as an active layer. The active shell may emit any color light, such as blue, green or red light. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In an alternative embodiment, planar layers (32, 34) may be formed instead of the nanowire cores 32 and active region shells 34.

A second conductivity type semiconductor material layer 36 is formed on the sidewalls and faceted outer surfaces of the nanowires (32, 34). The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The assembly of the second conductivity type semiconductor material layer 36 and the nanowire cores (32, 34) can be patterned to form discrete light emitting areas. An optional transparent conductive layer 38, such as a transparent conductive oxide layer, can be deposited and patterned over the horizontally extending portion of the second conductivity type semiconductor material layer 36. An optional dielectric material layer 60 may be deposited over the transparent conductive oxide layer 38 and the second conductivity type semiconductor material layer 36. The dielectric material layer 60 includes a transparent dielectric material such as silicon oxide, silicon nitride, a dielectric metal oxide (such as aluminum oxide), organosilicate glass, or porous variants thereof. An opening can be formed through the dielectric material layer 60 in each region that overlies a respective cluster of nanowires (32, 34). A conductive reflector 82 can be formed over each cluster of nanowires (32, 34) and on a respective one of the transparent conducive layers 38 or a respective one of the second conductivity type semiconductor material layers 36 by depositing a conductive reflector layer and patterning the conductive reflector layer (e.g., Al and/or Ag reflector layer(s)). An insulating cap layer 70 can be formed over the conductive reflectors 82. An opening can be formed through each area of the insulating cap layer 70 that overlies a respective conductive reflector 82, and bonding pad layers (84, 86) can be formed in the openings and over the insulating cap layer 70. The bonding pad layers (84, 86), the insulating cap layer 70, the dielectric material layer 60, the growth mask layer 42, the doped compound semiconductor layer 26, and the buffer layer 24 can be patterned to form trenches that isolate each cluster of nanowires (32, 34) from other clusters of nanowires (32, 34).

Each laterally isolated portion of the structure overlying the transparent single crystalline substrate constitutes a light emitting diode 10. Solder balls 50 can be attached to each device-side bonding pad, which is a patterned portion of the bonding pad layers (84, 86). The assembly of the transparent single crystalline substrate and an array of light emitting diodes attached thereto is flipped upside down, and is disposed over the backplane 400. Each solder ball 50 on a light emitting diode 10 that needs to be attached to the backplane 400 can be reflowed so that an overlying light emitting diode 10 is bonded to the backplane. The reflow may be conducted by heating the solder balls by irradiating by an infrared laser beam through the backplane 400 or through the LEDs 10 onto the solder balls 50 or by annealing the device in a furnace or similar heating apparatus above the solder ball 50 melting temperature. Solder balls 50 that underlie light emitting diodes that need not be transferred are not irradiated by the infrared laser beam or have a composition with a higher melting point than the furnace anneal temperature.

Portions of the buffer layer 24 that overlie attached light emitting diodes 10 are sequentially irradiated by a high power laser beam, such as an ultraviolet or visible light laser beam, through the transparent single crystalline substrate. Thus, each light emitting diode 10 that is soldered to the backplane 400 can be detached from the transparent single crystalline substrate by laser irradiation. The first exemplary structure of FIGS. 1A and 1B can be thus provided.

Figure 2A:
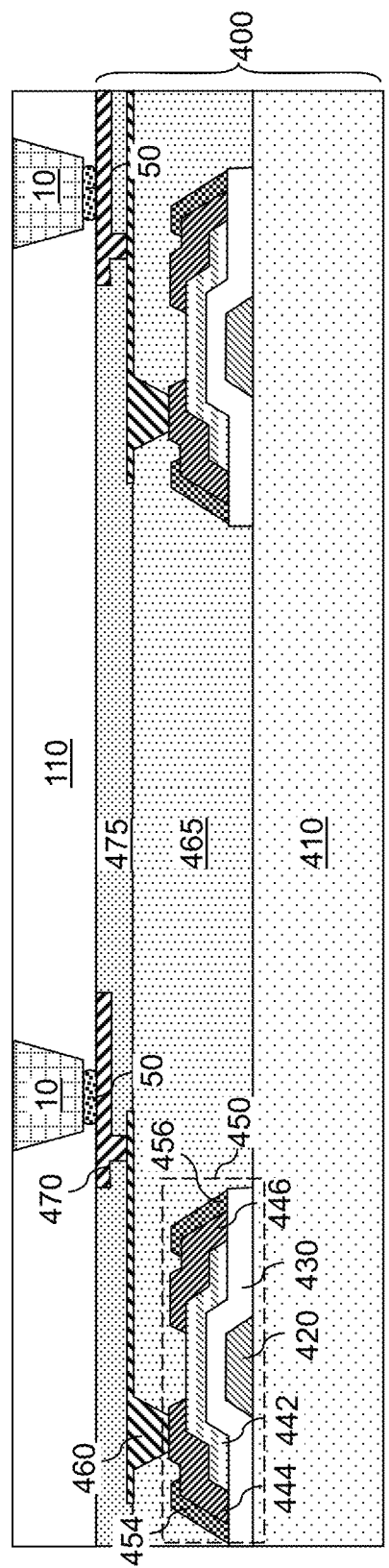
FIG. 2A is a vertical cross-sectional view of the first exemplary structure after depositing and planarizing a dielectric matrix layer according to the first embodiment of the present disclosure.
Figure 2B:
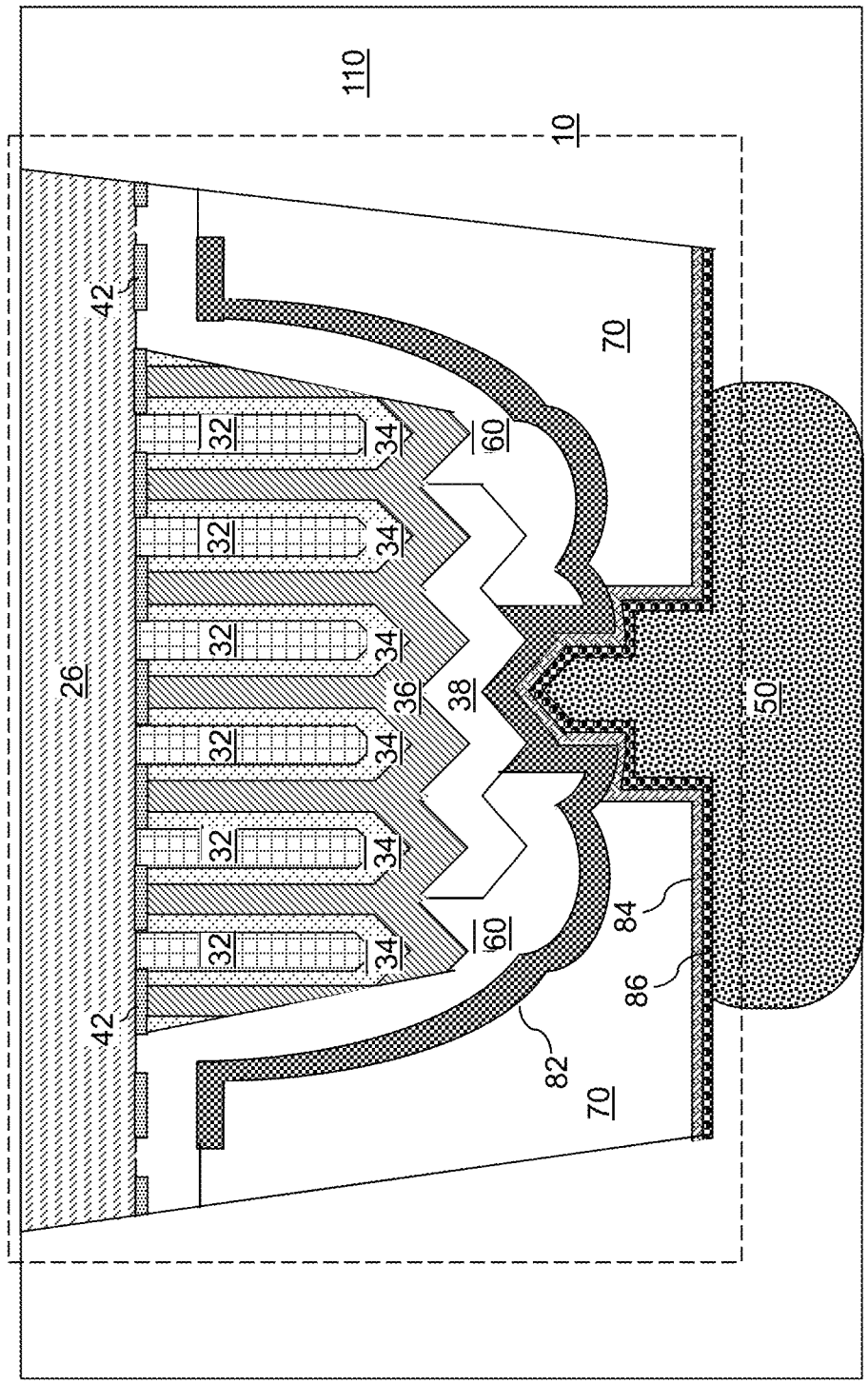
FIG. 2B is a magnified view of a region including a light emitting device within the structure of FIG. 2A.

Referring to FIGS. 2A and 2B, a planarizable dielectric material layer is deposited over the backplane 400 between the array of light emitting diodes 10. The planarizable dielectric material layer can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition or plasma enhanced chemical vapor deposition).

The planarizable dielectric material is either self-planarized if deposited by spin coating or can be subsequently planarized, for example, by chemical mechanical planarization (CMP). If any portion of the buffer layer 24 is present in the light emitting diodes, the remaining portions of the buffer layer 24 can be removed during the planarization process so that top surfaces of the doped compound semiconductor layer 26 are physically exposed after the planarization process. The remaining continuous portion of the planarizable dielectric material layer is herein referred to as a dielectric matrix layer 110. The dielectric matrix layer 110 embeds the array of light emitting diodes 10. The top surface of the dielectric matrix layer 110 can be coplanar with the top surfaces of the light emitting diodes 10. The dielectric matrix layer 110 is located on the front side of the backplane 400, and laterally surrounds the array of light emitting diodes 10.

Figure 3A:
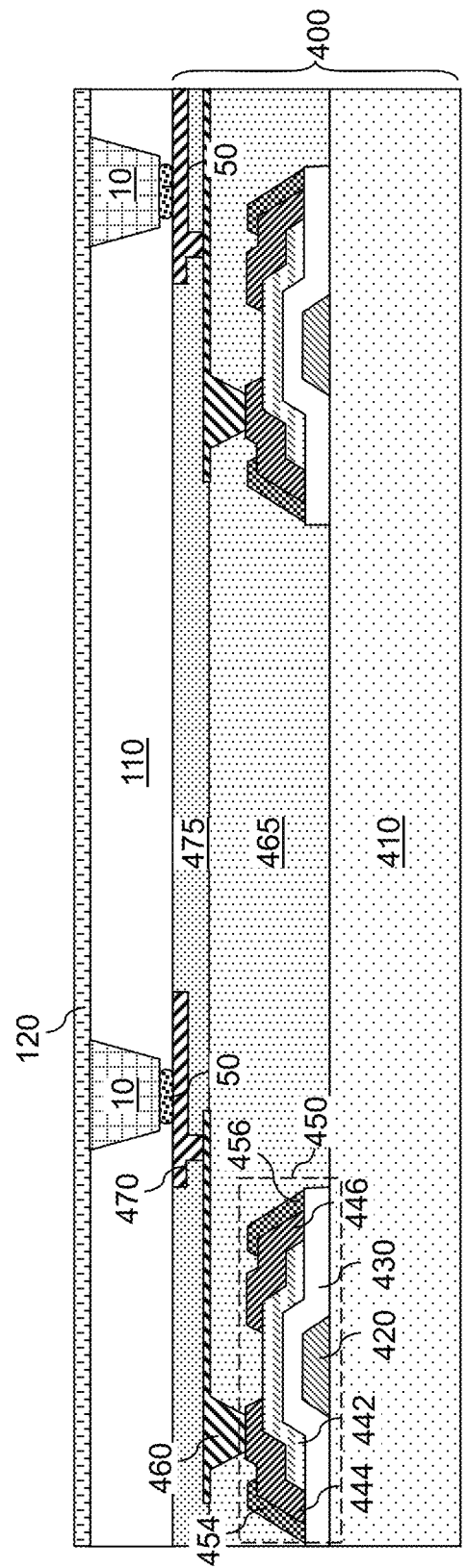
FIG. 3A is a vertical cross-sectional view of the first exemplary structure after formation of a transparent conductive layer according to the first embodiment of the present disclosure.
Figure 3B:
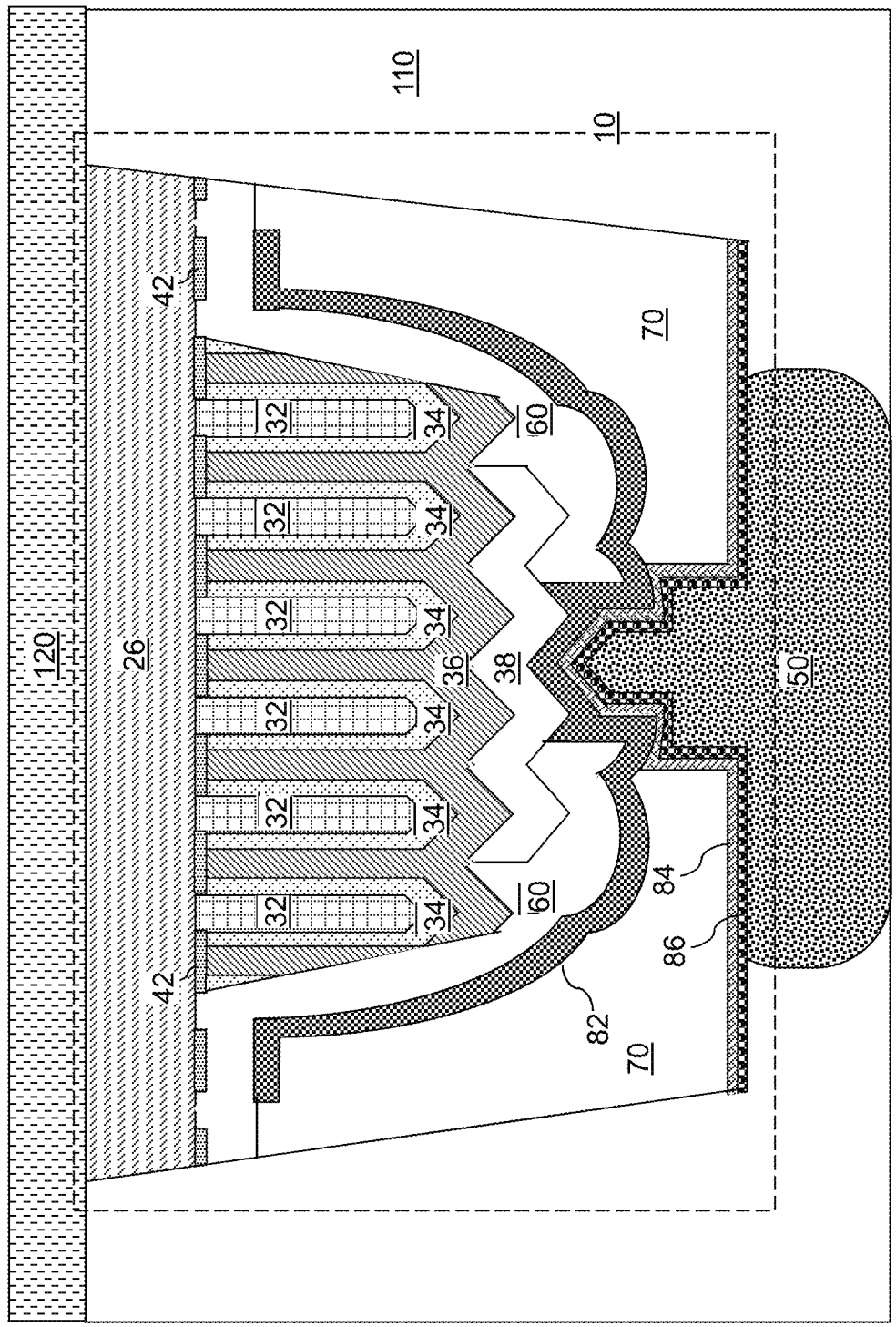
FIG. 3B is a magnified view of a region including a light emitting device within the structure of FIG. 3A.

Referring to FIGS. 3A and 3B, a transparent conductive layer 120 can be formed directly on the top surfaces, i.e., the front side surfaces, of the light emitting diodes 10. The transparent conductive layer 120 can include a transparent conductive material such as indium tin oxide or aluminum doped zinc oxide. The transparent conductive layer 120 can be deposited as a continuous material layer that extends across the entire area of the array of light emitting diodes 10. The thickness of the transparent conductive layer 120 can be in a range from 20 nm to 600 nm, such as from 100 nm to 300 nm, although lesser and greater thicknesses can also be employed. The transparent conductive layer 120 can function as a common electrode (such as a cathode) of the array of light emitting diodes 10. The transparent conductive layer 120 forms a part of a bus electrode for the device.

Figure 4A:
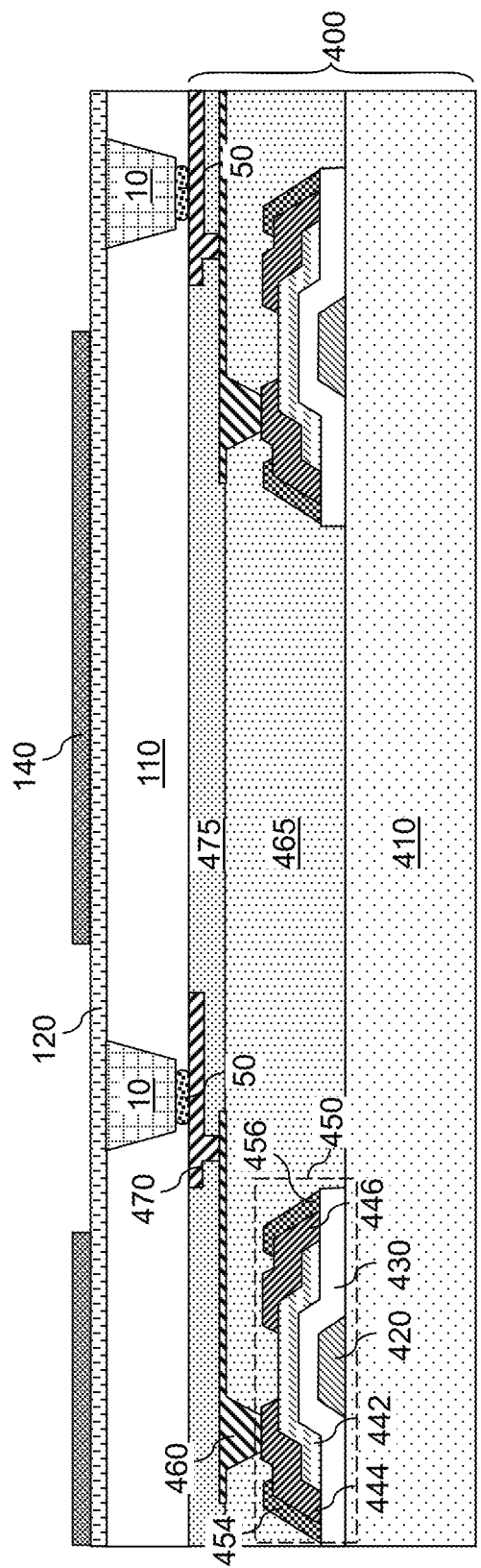
FIG. 4A is a vertical cross-sectional view of the first exemplary structure after formation of a patterned light-absorptive conductive layer as a patterned bus electrode layer according to the first embodiment of the present disclosure.
Figure 4B:
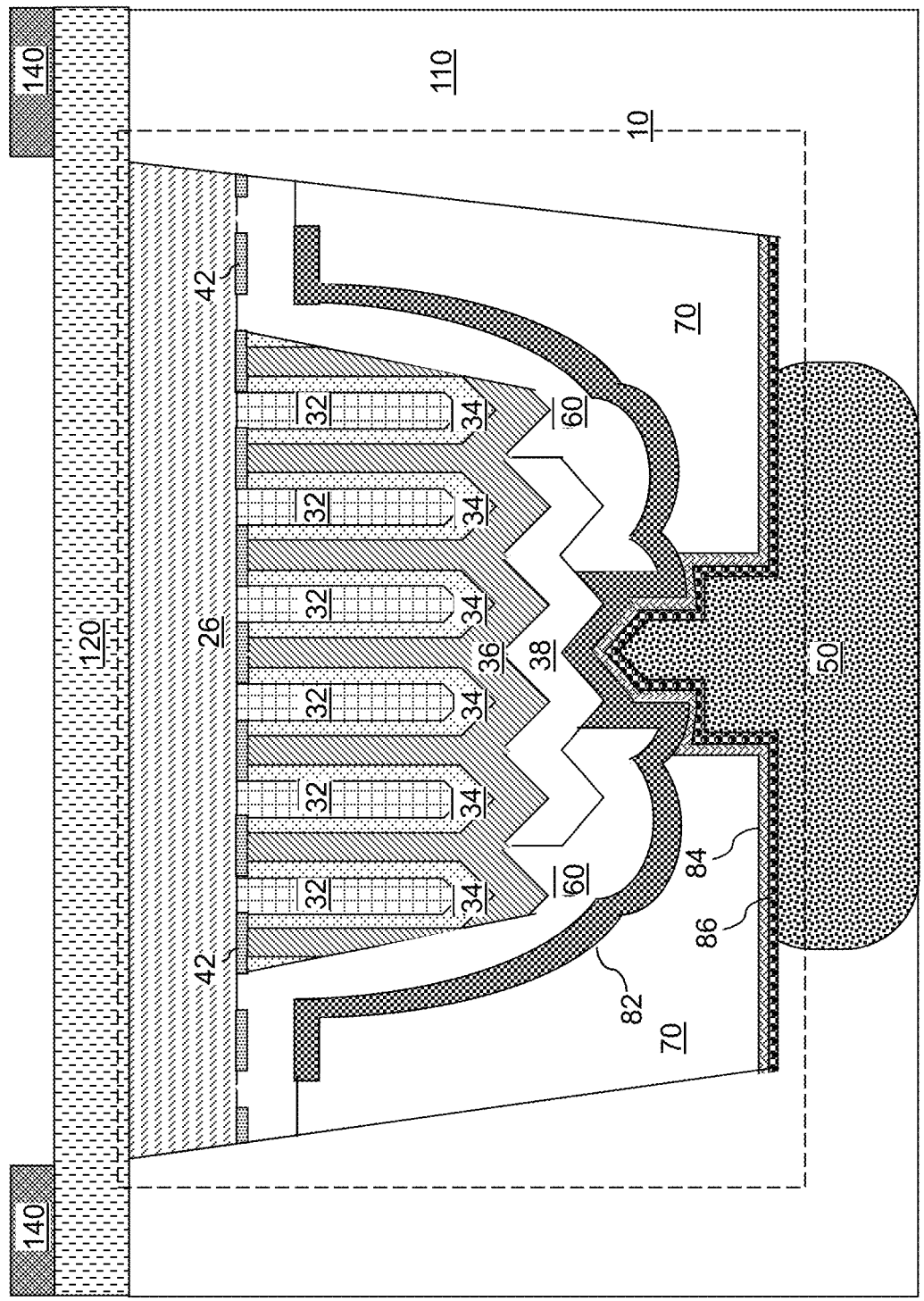
FIG. 4B is a magnified view of a region including a light emitting device within the structure of FIG. 4A.

Referring to FIGS. 4A and 4B, a light-absorptive conductive layer 140 is formed over the top surface of the transparent conductive layer 120 by deposition and patterning of at least one material layer. The light-absorptive conductive layer 140 has a higher absorptivity than the transparent conductive layer 120. As used herein, a "light-absorptive conductive layer" refers to a layer including at least one conductive material and absorbs more than 90% of visible light (i.e., radiation having a wavelength between 400 nm and 800 nm). As used herein, light absorption or light reflection is measured by a percentage of an incident light energy that is absorbed or reflected for the wavelength range from 400 nm to 800 nm, i.e., only within the visible spectrum. Each of the at least one conductive material has electrical conductivity greater than $1.0 \times 10^5$ S/cm. The light-absorptive conductive layer 140 may include a single material layer providing electrical conductivity greater than $1.0 \times 10^5$ S/cm and providing absorption of more than 90%, and/or more than 95%, of visible light, or may include multiple material layers such that one or more of the material layers provide electrical conductivity greater than $1.0 \times 10^5$ S/cm, and one or more different material layers provide absorption of more than 90%, and/or more than 95%, of visible light. The light-absorptive conductive layer 140 is more electrically conductive than the transparent conductive layer 120. For example, the light-absorptive conductive layer 140 has an electrical conductivity that is at least 25% higher, such as 50% to 300% than that of the transparent conductive layer 120.

For example, the at least one material layer can be deposited over the transparent conductive layer 120, and a photoresist layer can be applied over the at least one material layer. The photoresist layer can be lithographically patterned by lithographic exposure and development, and an etch process can be performed to etch the materials of the at least one material layer employing the patterned photoresist layer as an etch mask. The etch chemistry can be selected to etch the material(s) of the at least one material layer of the light-absorptive conductive layer 140. If the at least one material layer comprises multiple material layers, the multiple material layers may be sequentially etched employing a series of different etch chemistries. The etch process can form an array of openings through the at least one material layer. The patterned light-absorptive conductive layer 140 is a patterned bus electrode layer, which forms part of the bus electrode that functions as a common electrode for each light emitting diode 10 within the array of light emitting diodes 10. The photoresist layer can be subsequently removed, for example, by ashing. The bus electrode comprises a combination of the light-absorptive conductive layer 140 and the transparent conductive layer 120.

FIGS. 5A-5D illustrate first through fourth layouts for the array of light emitting diodes 10 and the light-absorptive conductive layer 140, i.e., the patterned bus electrode layer. The light-absorptive conductive layer 140 is electrically shorted to the transparent conductive layer 120 and includes an array of openings therein. Each light emitting diode 10 within the array of light emitting diodes 10 can be located within an area of a respective opening through the light-absorptive conductive layer 140, i.e., the patterned bus electrode layer. In one embodiment, a periphery of each opening within the patterned bus electrode layer can be laterally offset outward from a periphery of a respective light emitting diode 10 that is laterally enclosed therein.

Figure 5B:
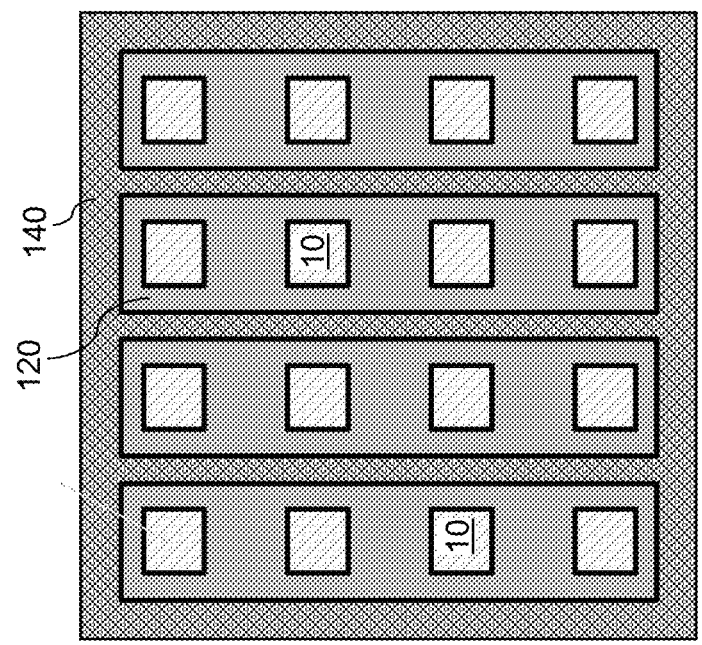
FIG. 5B is a plan view of a second layout for the first exemplary structure according to the first embodiment of the present disclosure.
Figure 5A:
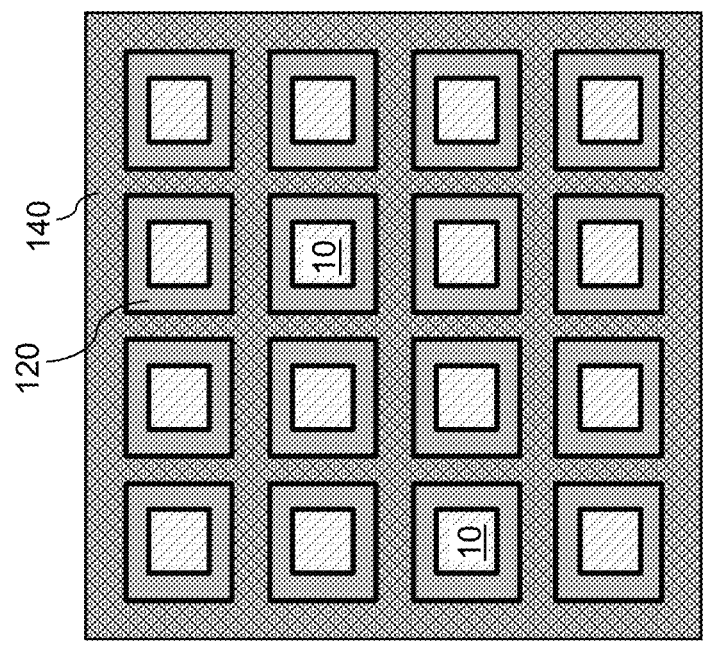
FIG. 5A is a plan view of a first layout for the first exemplary structure according to the first embodiment of the present disclosure.
Figure 5C:
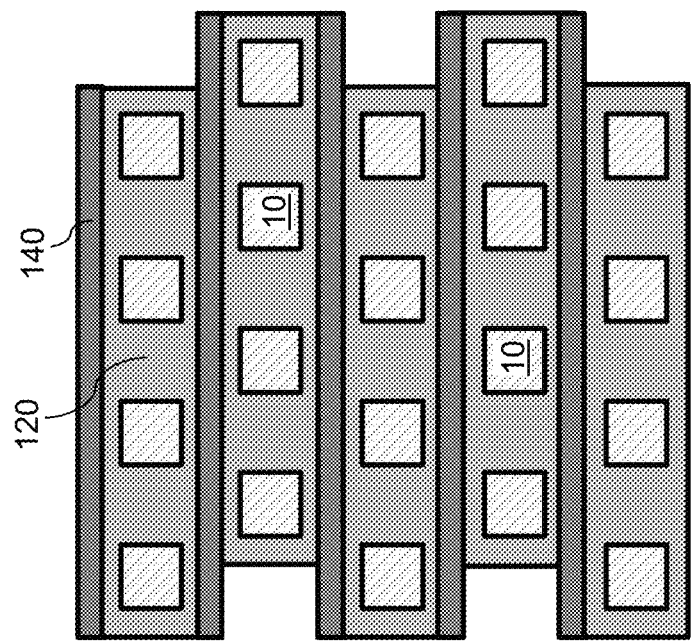
FIG. 5C is a plan view of a third layout for the first exemplary structure according to the first embodiment of the present disclosure.
Figure 5D:
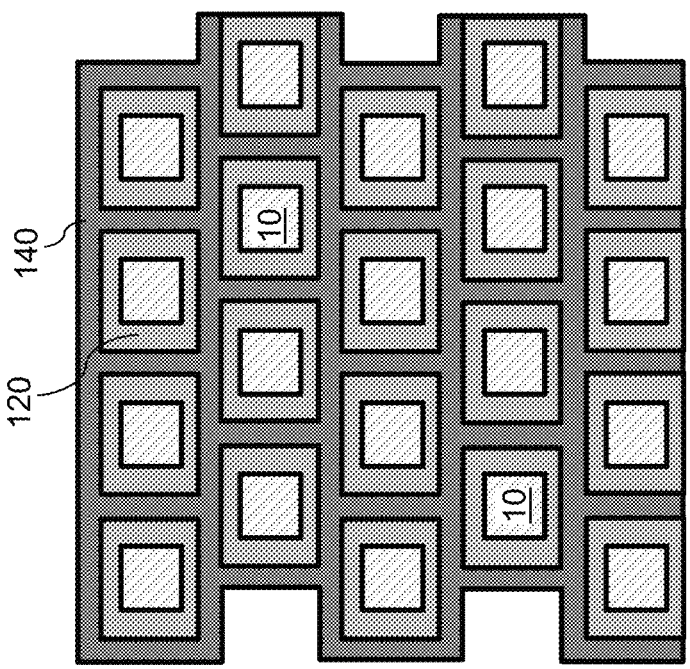
FIG. 5D is a plan view of a fourth layout for the first exemplary structure according to the first embodiment of the present disclosure.

Generally, the patterned bus electrode layer of embodiments of the present disclosure can reduce reflectance from incoming ambient light to increase the contrast ratio and compensate for the higher resistance of the transparent conductive layer 120 which reduces or prevents an IR drop. The shapes of openings in the patterned bus electrode layer can be selected to expose only a single light emitting diode 10 (as in the configurations of FIGS. 5A and 5C), or to expose a row of light emitting diodes 10 (as in the configuration of FIGS. 5B and 5D). Alternatively, the shapes of openings in the patterned bus electrode layer can be selected to expose a group of light emitting diodes 10 that constitutes a single pixel, which can include a set of subpixels emitting light at different peak wavelengths. The patterned bus electrode layer comprises at least one conductive material layer and provides a higher light absorption than top surfaces of the light emitting diodes 10. The LEDs 10 may be arranged in a rectangular grid of rows and columns as shown in FIGS. 5A and 5B, or the LEDs 10 may have a staggered configuration in which the LEDs are arranged in row or column direction but are offset from each other in the other one of the column or row direction, as shown in FIGS. 5C and 5D.

Various layer stacks may be employed for the at least one material layer that constitutes the light-absorptive conductive layer 140. FIGS. 6A-6D illustrate various configurations for the at least one material layer, which may include multiple material layers, of the light-absorptive conductive layer 140.

Referring to FIGS. 6A and 6B, the at least one conductive material layer within the light-absorptive conductive layer 140 can include a metal layer 143. For example, the light-absorptive conductive layer 140 can include a stack of a metal layer 143, and a light-absorptive layer (145 or 147) providing higher light absorption of the visible light than the metal. The light-absorptive layer (145 or 147) can provide absorption of more than 90%, and/or more than 95%, of visible light.

Referring to FIG. 6A, a first exemplary light-absorptive conductive layer 140 can include at least two, such as three conductive material layers (141, 143, 145) such that the at least two conductive material layers (141, 143, 145) provide electrically conductive paths and provide absorption of more than 90%, and/or more than 95%, of visible light. The first exemplary light-absorptive conductive layer 140 of FIG. 6A includes a vertical stack, from bottom to top, of an optional conductive buffer layer 141, the metal layer 143, and a metallic light-absorptive layer 145 including a conductive metallic material. The optional conductive buffer layer 141 can be a conductive adhesion promotion layer such as a chromium layer. The metallic light-absorptive layer 145 is a light-absorptive layer that provides absorption of more than 90%, and/or more than 95%, of visible light. For example, the at least two conductive material layers for the light-absorptive conductive layer 140 can be selected from a stack of a copper layer (as the metal layer 143) and a chromium layer (as the metallic light-absorptive layer 145); a stack of a first chromium layer, a copper layer (as the metal layer 143), and a second chromium layer (as the metallic light-absorptive layer 145); a stack of a gold layer (as the metal layer 143) and a chromium layer (as the metallic light-absorptive layer 145); and a stack of an aluminum layer (as the metal layer 143) and a chromium or molybdenum layer (as the metallic light-absorptive layer 145). The thickness of the conductive buffer layer 141 can be in a range from 10 nm to 1,000 nm, the thickness of the metal layer 143 can be in a range from 0.5 micron to 10 microns, and the thickness of the metallic light-absorptive layer 145 can be in a range from 10 nm to 1,000 nm, although lesser and greater thicknesses can also be employed for each of the layers.

Referring to FIG. 6B, a second exemplary light-absorptive conductive layer 140 can include at least one conductive material layer (141, 143) and at least one dielectric material layer 147 such that the at least one conductive material layer (141, 143) provides electrically conductive paths and the at least one dielectric material layer 147 provides absorption of more than 90%, and/or more than 95%, of visible light. The second exemplary light-absorptive conductive layer 140 of FIG. 6B includes a vertical stack, from bottom to top, of an optional conductive buffer layer 141, the metal layer 143, and a dielectric light-absorptive layer 147 including a light-absorbing dielectric material. The optional conductive buffer layer 141 can be a conductive adhesion promotion layer such as a chromium layer. The dielectric light-absorptive layer 147 is a light-absorptive layer that provides absorption of more than 90%, and/or more than 95%, of visible light. In one embodiment, the at least one dielectric material layer 147 comprises a metal oxide material embedded in a resin. For example, the dielectric light-absorptive layer 147 can include "black" dielectric materials such as molybdenum oxide or other dielectric metal oxide embedded in a dielectric matrix material such as silicone or a resin. The thickness of the conductive buffer layer 141 can be in a range from 10 nm to 1,000 nm, the thickness of the metal layer 143 can be in a range from 0.5 micron to 10 microns, and the thickness of the dielectric light-absorptive layer 147 can be in a range from 100 nm to 10 microns, although lesser and greater thicknesses can also be employed for each of the layers.

Figure 6D:
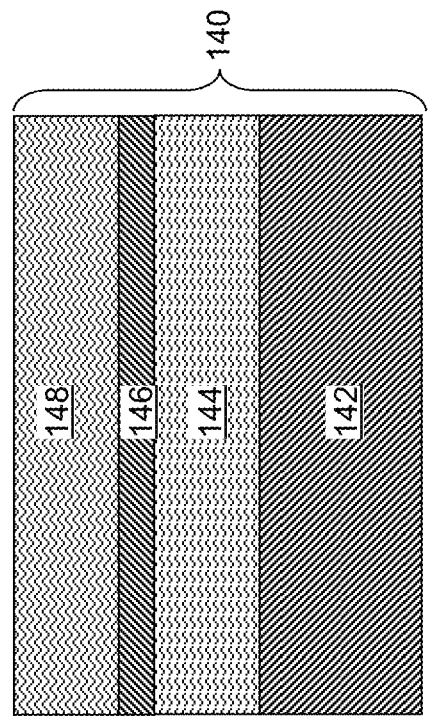
FIG. 6D is a vertical cross-sectional view of a fourth exemplary light-absorptive conductive layer according to the first embodiment of the present disclosure.
Figure 6C:
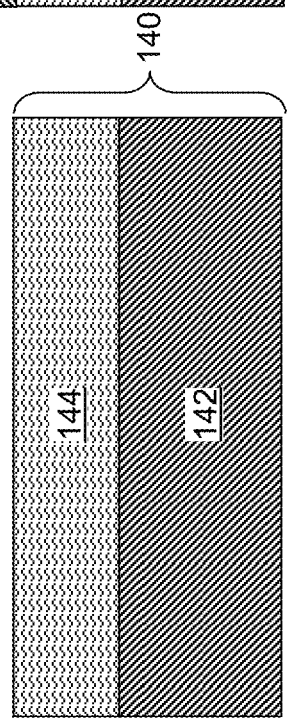
FIG. 6C is a vertical cross-sectional view of a third exemplary light-absorptive conductive layer according to the first embodiment of the present disclosure.

Referring to FIGS. 6C and 6D, the at least one conductive material layer within the light-absorptive conductive layer 140 can include a metal layer 142 and additional material layers that provide light absorption. For example, the light-absorptive conductive layer 140 can include a stack of a metal layer 142, and a light-absorptive layer {(144, 146) or (144, 146, 148)} providing higher light absorption of the visible light than the metal. The light-absorptive layer {(144, 146) or (144, 146, 148)} can include at least one phase matching dielectric layer (144, 148) that provides absorption of more than 90%, and/or more than 95%, of visible light when disposed over any reflective layer such as the metal layer 142.

A phase matching dielectric layer (144, 148) is a dielectric layer that induces destructive interference of incoming light along a direction normal to the surface of light incidence upon disposition on a reflective surface such as a top surface of the metal layer 142 or the top surface of a phase-modulation metal layer 146. The phase-modulation metal layer 146 is a metal layer having a thickness that induces phase change in the light path for the light that propagates therethrough such that light rays reflected by the phase-modulation metal layer 146 and adjacent reflective layers generate destructive interference on the side of light incidence. The front surface of each phase matching dielectric layer (144, 148) is parallel to the front surface of the backplane 400, and the destructive interference of incoming light occurs along the direction normal to the front surface of the backplane 400 and facing away from the backplane 400.

Various types of phase matching dielectric layers known in the art may be employed for the phase matching dielectric layer(s) (144, 148) within the light-absorptive conductive layer 140 of the present disclosure. For example, exemplary phase matching dielectric layers are described in Yong-Hee Lee, "A Black Metal-dielectric Thin Film for High-contrast Displays," Journal of the Korean Physical Society, Vol. 55, No. 2, August 2009, the entire contents of which are incorporated herein by reference.

Referring to FIG. 6C, a third exemplary light-absorptive conductive layer 140 can include a metal layer 142 as at least one conductive material layer and a phase matching dielectric (e.g., absorptive) layer 144. The metal layer 142 provides electrically conductive paths. The light-absorptive layer 144 provides absorption of more than 90%, and/or more than 95%, of visible light. The third exemplary light-absorptive conductive layer 140 of FIG. 6C includes a vertical stack, from bottom to top, of an optional conductive buffer layer (not shown), the metal layer 142, and the first phase matching dielectric layer 144. The optional conductive buffer layer can be a conductive adhesion promotion layer such as a chromium layer. The metal layer 142 can include aluminum, copper, tungsten, molybdenum, cobalt, or any other reflective metallic material, and can have a thickness in a range from 100 nm to 10 microns. The first phase matching dielectric layer 144 can be a silicon oxide layer, a silicon nitride layer, or a dielectric oxide layer, and can have a thickness in a range from 40 nm to 120 nm, although lesser and greater thicknesses can also be employed.

Referring to FIG. 6D, a fourth exemplary light-absorptive conductive layer 140 can include a metal layer 142 as at least one conductive material layer and a combination of a first phase matching dielectric layer 144, a phase-modulation metal layer 146, and a second phase matching dielectric layer 148 as a light-absorptive layer (144, 146, 148). The metal layer 142 provides electrically conductive paths. The light-absorptive layer (144, 146, 148) provides absorption of more than 90%, and/or more than 95%, of visible light. The fourth exemplary light-absorptive conductive layer 140 of FIG. 6D includes a vertical stack, from bottom to top, of an optional conductive buffer layer (not shown), the metal layer 142, the first phase matching dielectric layer 144, the phase-modulation metal layer 146, and the second phase matching (which can also be referred to as phase compensation) dielectric layer 148. The optional conductive buffer layer can be a conductive adhesion promotion layer such as a chromium layer. The metal layer 142 can include aluminum, copper, tungsten, molybdenum, cobalt, or any other reflective metallic material, and can have a thickness in a range from 100 nm to 10 microns. The first phase matching dielectric layer 144 can be a silicon oxide layer, a silicon nitride layer, or a dielectric oxide layer, and can have a thickness in a range from 40 nm to 120 nm, although lesser and greater thicknesses can also be employed. The phase-modulation metal layer 146 can include a metal such as chromium, molybdenum, or tungsten, and can have a thickness in a range from 2 nm to 16 nm, although lesser and greater thicknesses can also be employed. The second phase matching dielectric layer 148 can be a silicon oxide layer, a silicon nitride layer, or a dielectric oxide layer, and can have a thickness in a range from 40 nm to 120 nm, although lesser and greater thicknesses can also be employed.

In the first exemplary structure, the patterned bus electrode layer 140 is located on the front side surface of the transparent conductive layer 120. Generally, the patterned bus electrode layer 140 may be formed prior to, or after, formation of the transparent conductive layer.

Figure 7:
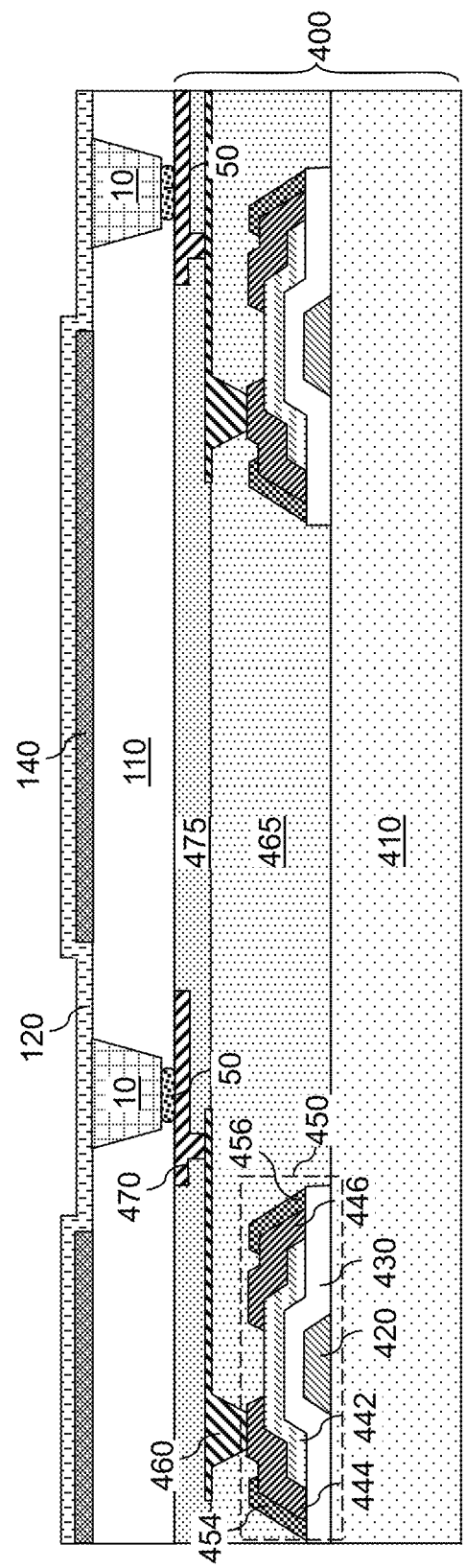
FIG. 7 is a vertical cross-sectional view of a second exemplary structure after formation of a patterned light-absorptive conductive layer and a transparent conductive layer according to a second embodiment of the present disclosure.

Referring to FIG. 7, a second exemplary structure according to a second embodiment of the present disclosure is illustrated after formation of a patterned light-absorptive conductive layer 140 and a transparent conductive layer 120. In this case, the patterned light-absorptive conductive layer 140 is deposited and patterned directly on the top surface of the dielectric matrix layer 110, and the transparent conductive layer 120 is deposited on the top surface of the patterned light-absorptive conductive layer 140. The patterned light-absorptive conductive layer 140 constitutes a patterned bus electrode layer electrically shorted to the transparent conductive layer 120. Thus, the patterned bus electrode layer can be located on the backside surface of the transparent conductive layer 120. The patterned light-absorptive conductive layer 140 includes an array of openings therein such that each light emitting diode 10 within the array of light emitting diodes 10 is located within an area of a respective opening through the patterned bus electrode layer. Any of the patterns discussed above can be employed for the patterned light-absorptive conductive layer 140.

Figure 8:
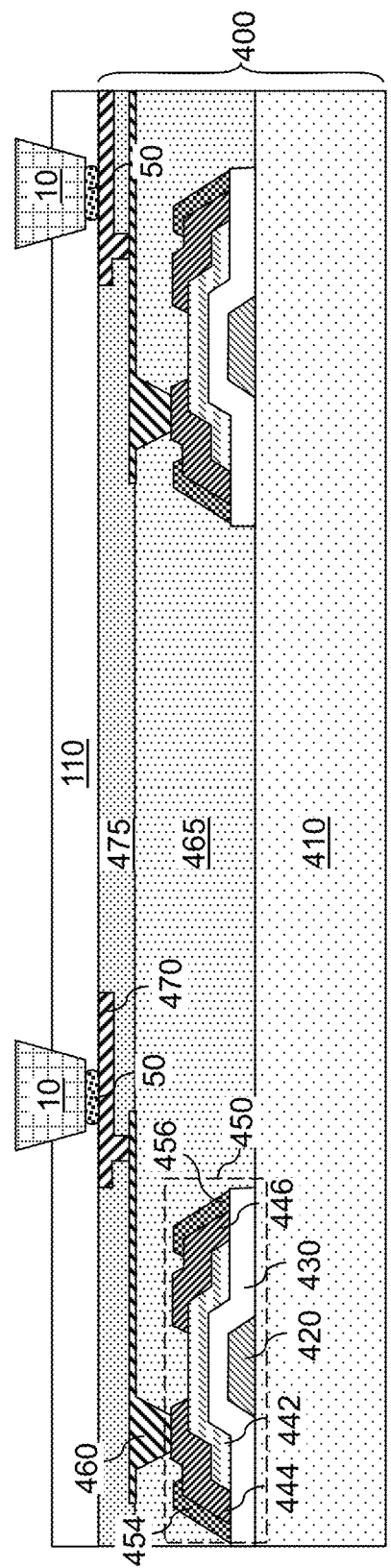
FIG. 8 is a vertical cross-sectional view of a third exemplary structure after recessing a dielectric matrix layer according to a third embodiment of the present disclosure.

Referring to FIG. 8, a third exemplary structure according to a third embodiment of the present disclosure can be derived from the first exemplary structure of FIGS. 2A and 2B by recessing the top surface of the dielectric matrix layer 110 with respective to the top surfaces of the light emitting diodes 10. An etch process that etches the material of the dielectric matrix layer 110 selective to the material of the doped compound semiconductor layers 26 of the light emitting diodes 10 may be employed. The etch process can be an isotropic etch process or an anisotropic etch process. For example, if the dielectric matrix layer 110 includes a silicon oxide material, a wet etch process employing dilute hydrofluoric acid may be employed to vertically recess the top surface of the dielectric matrix layer 110. The recess depth can be selected to match the total thickness of material layers to be subsequently formed in the recessed region. For example, the recess depth may be in a range from 1 micron to 30 microns, although lesser and greater thicknesses can also be employed.

Figure 9:
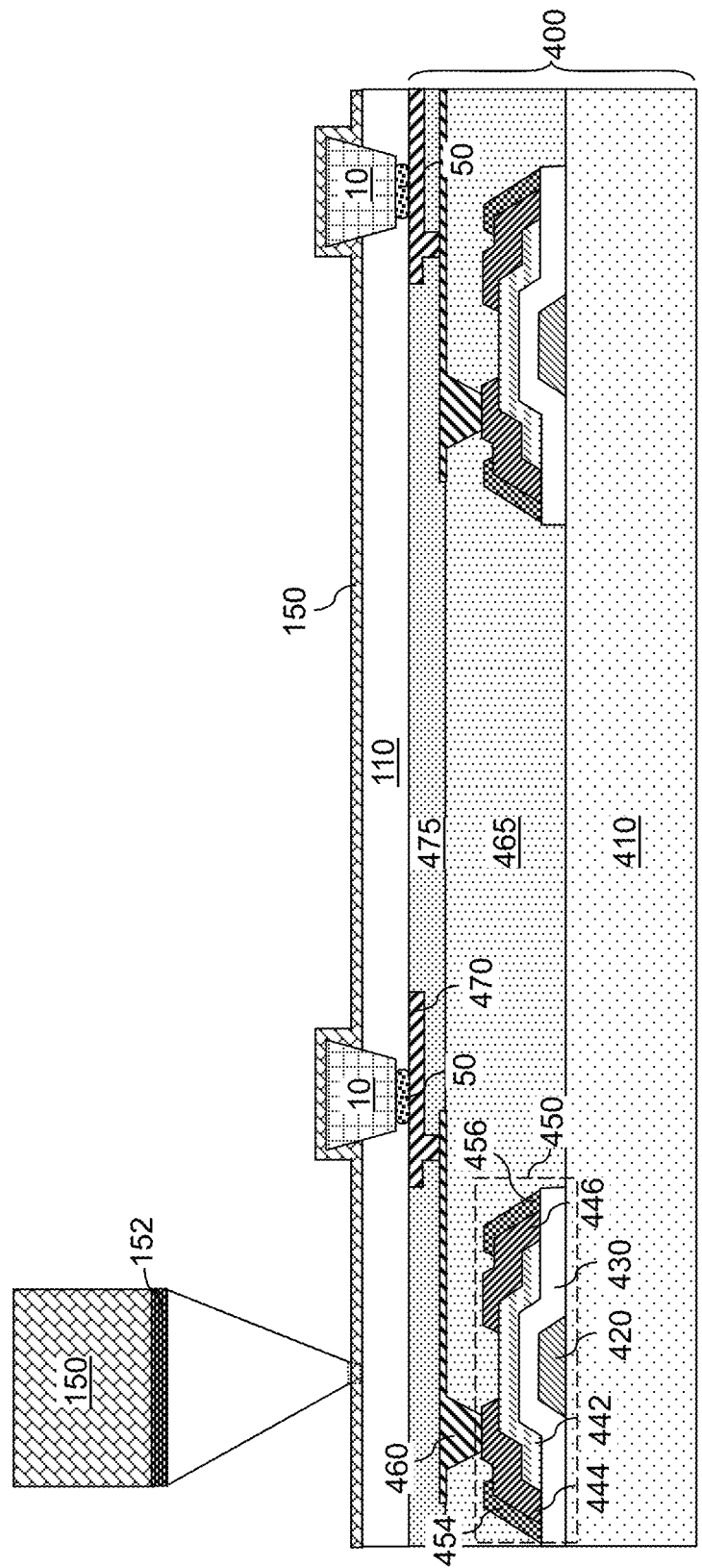
FIG. 9 is a vertical cross-sectional view of the third exemplary structure after formation of a reflective metal layer according to the third embodiment of the present disclosure.

Referring to FIG. 9, an optional conductive metallic liner 152 and a reflective metal layer 150 can be sequentially deposited over the array of light emitting diodes 10 and the recessed dielectric matrix layer 110. The conductive metallic liner 152 can include a conductive metal nitride material such as TiN, TaN, and/or WN, and functions as a diffusion barrier layer that prevents diffusion of the metal in the reflective metal layer 150. Horizontal portions of the conductive metallic liner 152 can be in a range from 5 nm to 100 nm, such as from 10 nm to 30 nm, although lesser and greater thicknesses can also be employed. The reflective metal layer 150 includes a metallic material that reflects more than 50% of visible light. The reflective metal layer 150 has a higher reflectivity than the transparent conductive layer 120. For example, the reflective metal layer 150 includes a reflective metal such as gold, silver, copper, or aluminum. The thickness of the reflective metal layer 150 can be in a range from 300 nm to 3 microns, although lesser and greater thicknesses can also be employed. The reflective metal layer 150 is more electrically conductive than the transparent conductive layer 120. For example, the reflective metal layer 150 has an electrical conductivity that is at least 25% higher, such as 50% to 300% than that of the transparent conductive layer 120. The reflective metal layer 150 also has a higher reflectance and lower transmissivity of visible light than transparent conductive layer 120.

Figure 10:
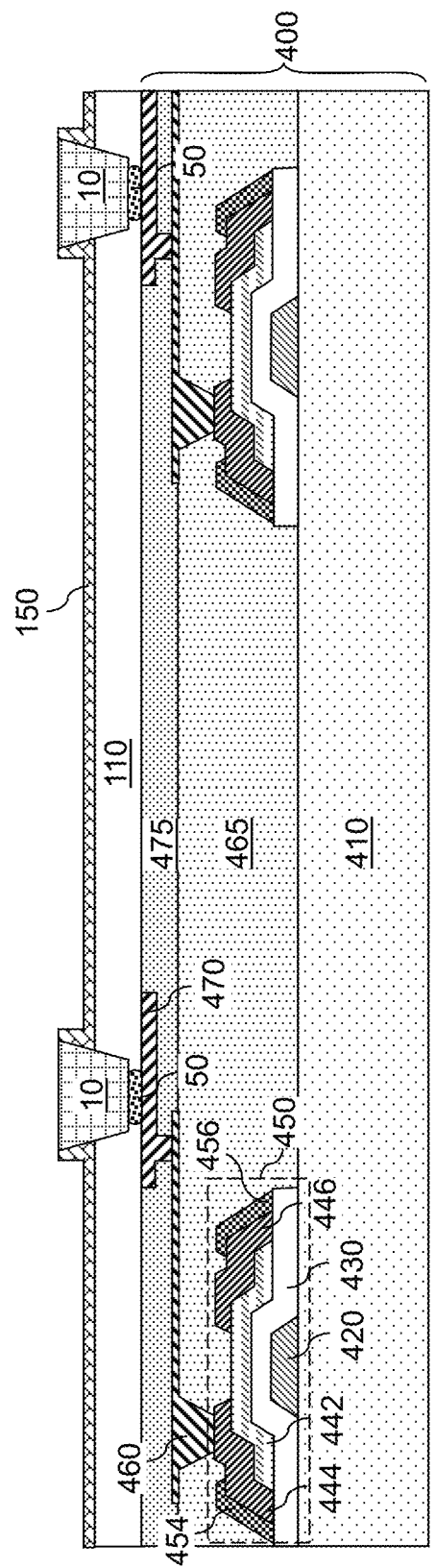
FIG. 10 is a vertical cross-sectional view of the third exemplary structure after removing protruding portions of the reflective metal layer by a planarization process according to the third embodiment of the present disclosure.

Referring to FIG. 10, a planarization process such as chemical mechanical planarization can be performed to remove portions of the reflective metal layer 150 and the optional conducive metallic liner 152 that overlie the top surfaces of the light emitting diodes 10. The patterned reflective metal layer 150 is a patterned bus electrode layer including an array of self-aligned openings therein. Thus, the layer stack of the patterned conductive metallic liner 152 and the patterned reflective metal layer 150 is a patterned bus electrode layer including an array of self-aligned openings therein. Specifically, each opening in the layer stack of the patterned conductive metallic liner 152 and the patterned reflective metal layer 150 coincides with an outer periphery of a respective one of the light emitting diodes 10.

The patterned reflective metal layer 150 includes a planar portion having a uniform thickness and contacting the top surface of the dielectric matrix layer 110. The planar portion of the patterned reflective metal layer 150 can be vertically recessed from the top surfaces of the light emitting diodes 10. Thus, the planar portion of the patterned reflective metal layer 150 can have a top surface that is more proximal to the backplane 400 than the top surfaces of the light emitting diodes 10 is to the backplane 400.

Figure 11:
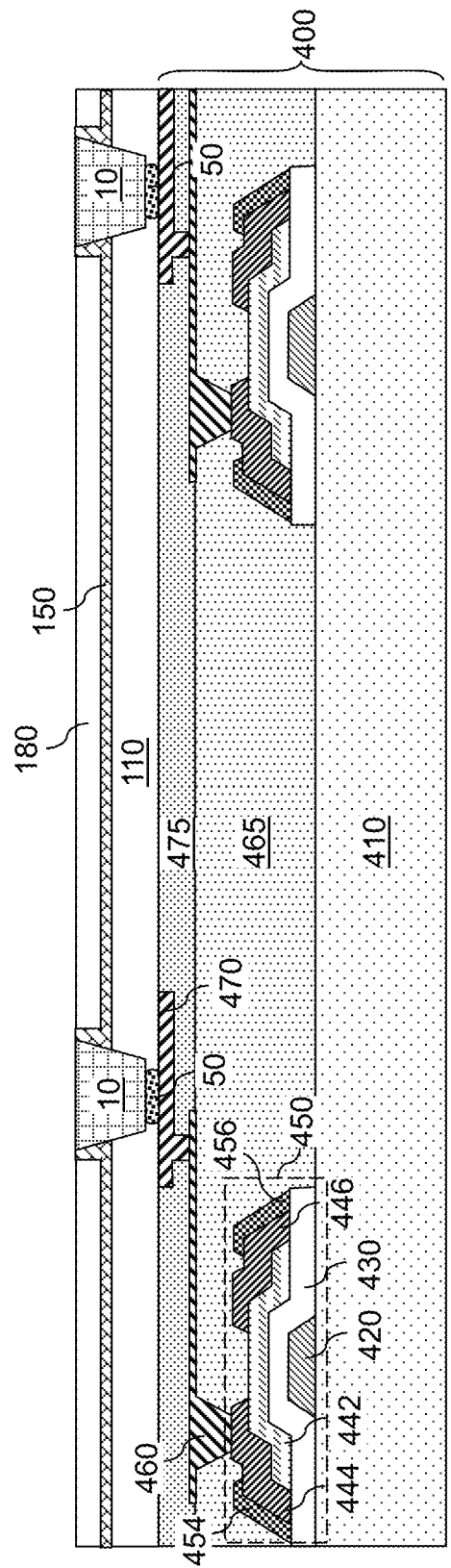
FIG. 11 is a vertical cross-sectional view of the third exemplary structure after formation of a dielectric fill material layer according to the third embodiment of the present disclosure.

Referring to FIG. 11, a planarizable dielectric fill material can be deposited over the reflective metal layer 150 among the light emitting diodes 10. The planarizable dielectric material can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition or plasma enhanced chemical vapor deposition). The planarizable dielectric material is either self-planarized if deposited by spin coating or can be subsequently planarized, for example, by chemical mechanical planarization (CMP) employing the top surfaces of the light emitting diodes 10 as stopping surfaces. The remaining continuous portion of the planarizable dielectric material is herein referred to as a dielectric fill material layer 180. The dielectric fill material layer 180 embeds the array of light emitting diodes 10. The top surface of the dielectric fill material layer 180 can be coplanar with the top surfaces of the light emitting diodes 10. The dielectric fill material layer 180 is located on the front side of the backplane 400, laterally surrounds the array of light emitting diodes 10, and is more distal from the backplane 400 than the dielectric matrix layer 110 is from the backplane 400. The dielectric fill material layer 180 can be a light-absorptive material, e.g., black color material, such as molybdenum oxide particles disposed in a resin layer described above.

Figure 12:
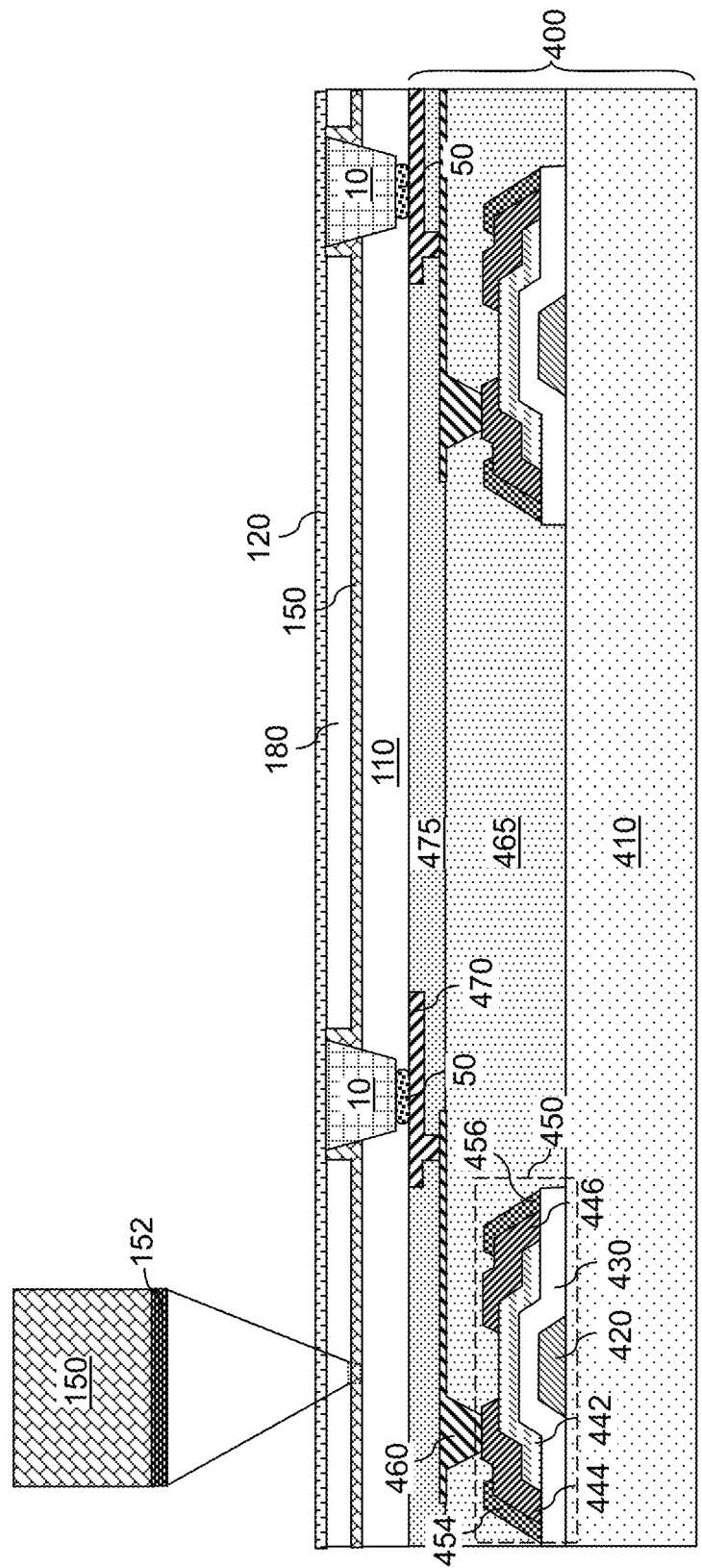
FIG. 12 is a vertical cross-sectional view of the third exemplary structure after formation of a transparent conductive layer according to the third embodiment of the present disclosure.

Referring to FIG. 12, a transparent conductive layer 120 can be formed directly on the top surfaces, i.e., the front side surfaces, of the light emitting diodes 10 and on the dielectric fill material layer 180. The composition and thickness of transparent conductive layer 120 can be the same as in the first embodiment. The transparent conductive layer 120 can function as a common electrode (such as a cathode) of the array of light emitting diodes 10 in conjunction with the reflective metal layer 150. The combination of the transparent conductive layer 120 and the reflective metal layer 150 (and optionally conductive metallic liner 152) forms the bus electrode for the device.

The reflective metal layer 150 functions as a patterned bus electrode layer electrically shorted to the transparent conductive layer 120. The reflective metal layer 150 includes an array of openings therein such that each light emitting diode 10 within the array of light emitting diodes 10 is located within an area of a respective opening through the reflective metal layer 150. The bottom surface of the transparent conductive layer 120 contacts an array of annular top surfaces of the reflective metal layer 150. Each annular surface has an inner periphery that is laterally spaced a periphery of a respective one of the light emitting diodes 10 by a thickness of the conductive metallic liner 152, and an outer periphery that is laterally offset from the inner periphery by a uniform offset distance. Thus, each contact area between the reflective metal layer 150 and the transparent conductive layer 120 can have a uniform width and a generally annular shape.

Figure 13A:
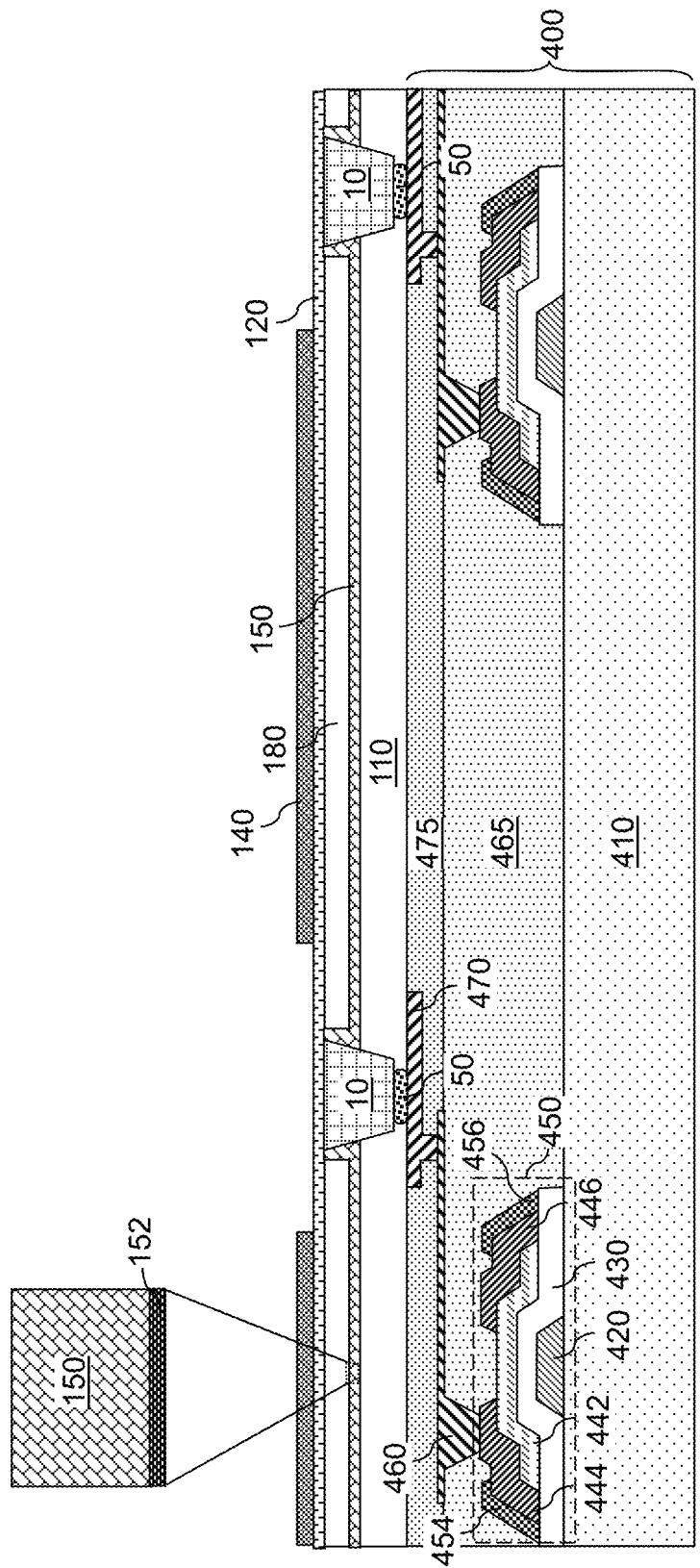
FIG. 13A is a vertical cross-sectional view of the third exemplary structure after formation of a patterned light-absorptive conductive layer according to the third embodiment of the present disclosure.
Figure 13B:
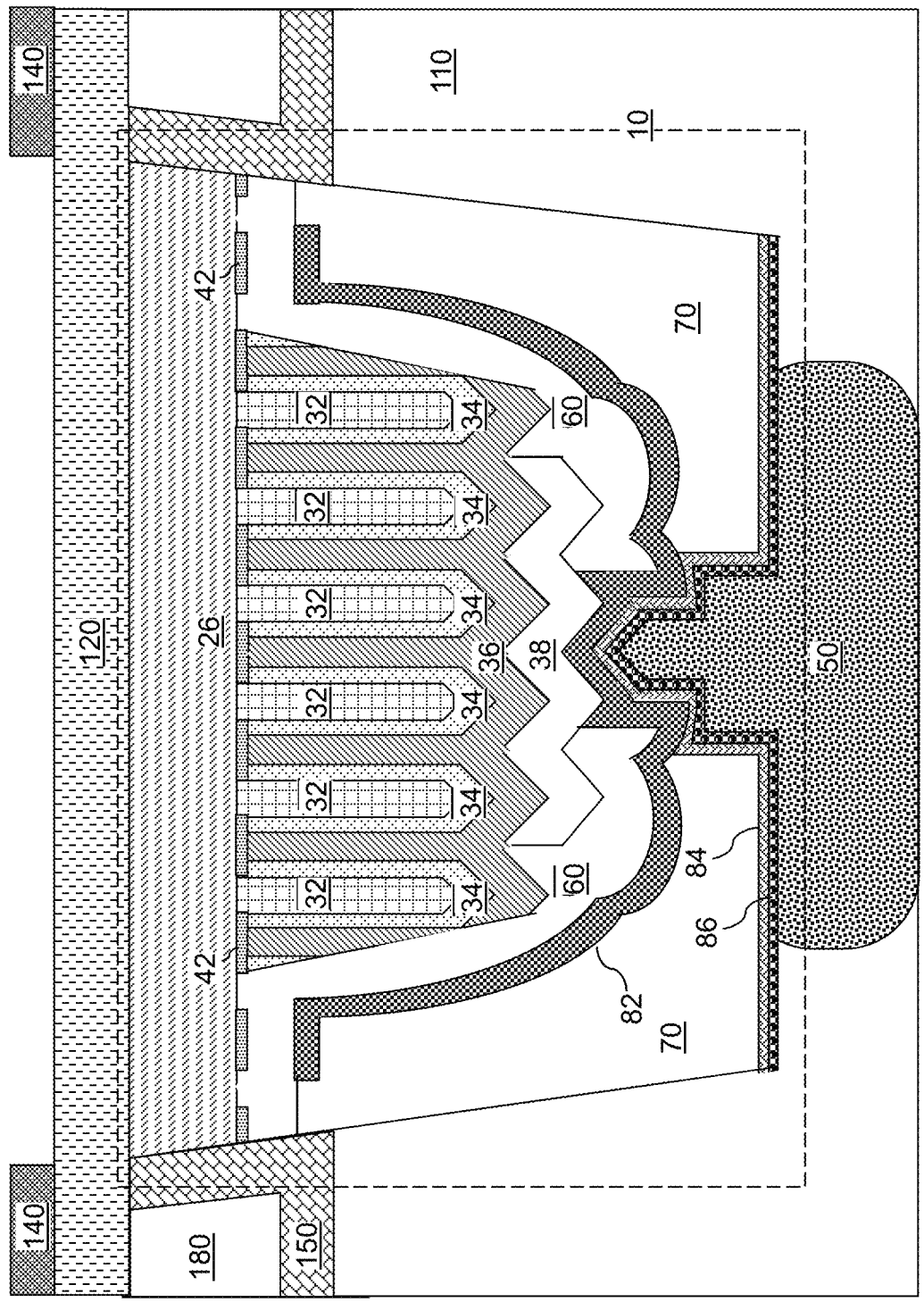
FIG. 13B is a magnified view of a region including a light emitting device within the structure of FIG. 13A.

Referring to FIGS. 13A and 13B, a light-absorptive conductive layer 140 may be optionally formed over the top surface of the transparent conductive layer 120 by deposition and patterning of at least one material layer. The material composition and the thickness of each component layer win the light-absorptive conductive layer 140 can be the same as in the first embodiment. Further, any of the patterns described above can be employed for the light-absorptive conductive layer 140. Thus, the light-absorptive conductive layer 140 may include a single material layer providing electrical conductivity greater than $1.0 \times 10^5$ S/cm and providing absorption of more than 90%, and/or more than 95%, of visible light, or may include multiple material layers such that one or more of the material layers provide electrical conductivity greater than $1.0 \times 10^5$ S/cm, and one or more different material layers provide absorption of more than 90%, and/or more than 95%, of visible light.

The combination of the optional conducive metallic liner 152, the reflective metal layer 150, and the light-absorptive conductive layer 140 functions as a patterned bus electrode layer electrically shorted to the transparent conductive layer 120. The combination of the transparent conductive layer 120, the light-absorptive conductive layer 140 and the reflective metal layer 150 (and optionally conductive metallic liner 152) forms the bus electrode for the device. The reflective metal layer 150 includes an array of openings therein such that each light emitting diode 10 within the array of light emitting diodes 10 is located within an area of a respective opening through the reflective metal layer 150. Further, the light-absorptive conductive layer 140 includes an array of openings therein such that each light emitting diode 10 within the array of light emitting diodes 10 is located within an area of a respective opening through the light-absorptive conductive layer 140. The bottom surface of the transparent conductive layer 120 contacts an array of annular top surfaces of the reflective metal layer 150. Each annular surface has an inner periphery that coincides with a periphery of a respective one of the light emitting diodes 10, and an outer periphery that is laterally offset from the inner periphery by a uniform offset distance. Thus, each contact area between the reflective metal layer 150 and the transparent conductive layer 120 can have a uniform width and a generally annular shape. The top surface of the transparent conducive layer contacts the bottom surface of the light-absorptive conductive layer 140.

Figure 14A:
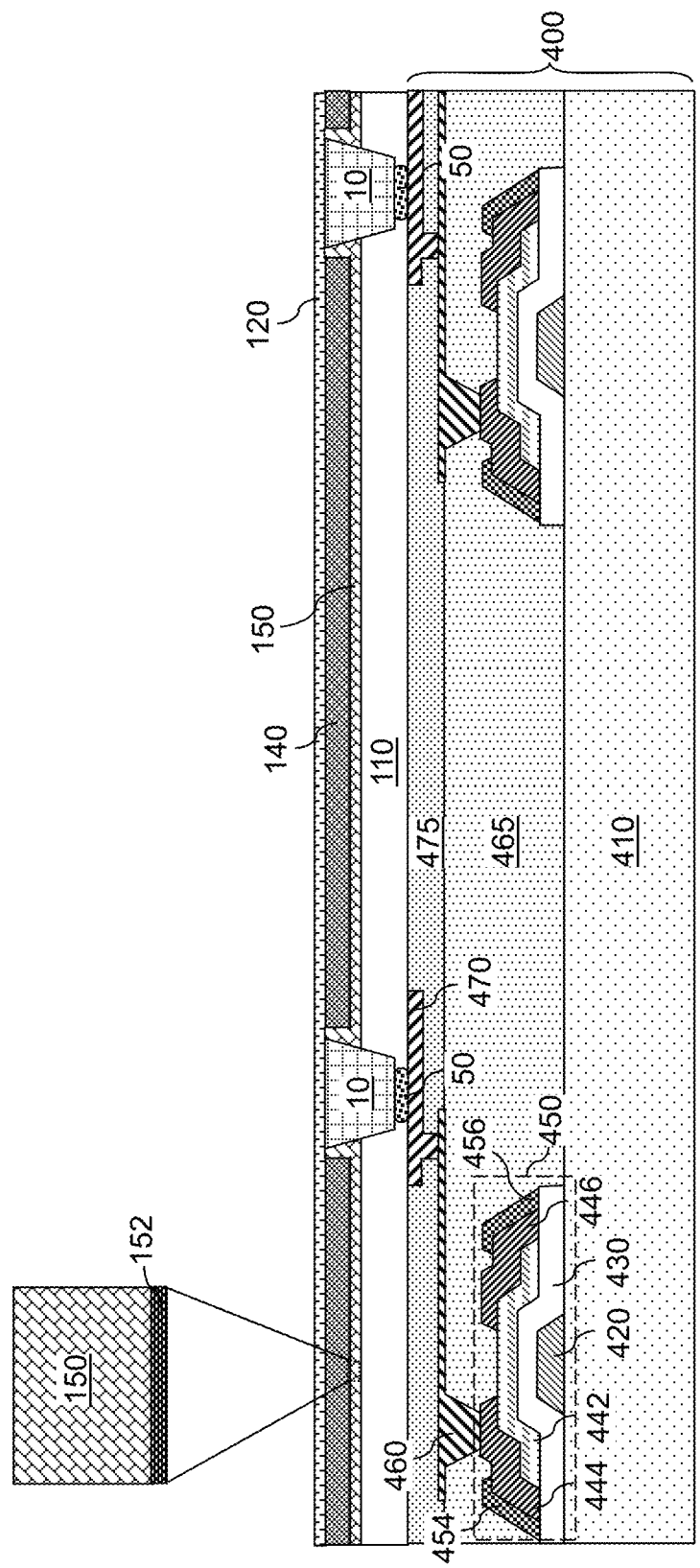
FIG. 14A is a vertical cross-sectional view of a fourth exemplary structure after formation of a patterned light-absorptive conductive layer and a transparent conducive layer according to a fourth embodiment of the present disclosure.
Figure 14B:
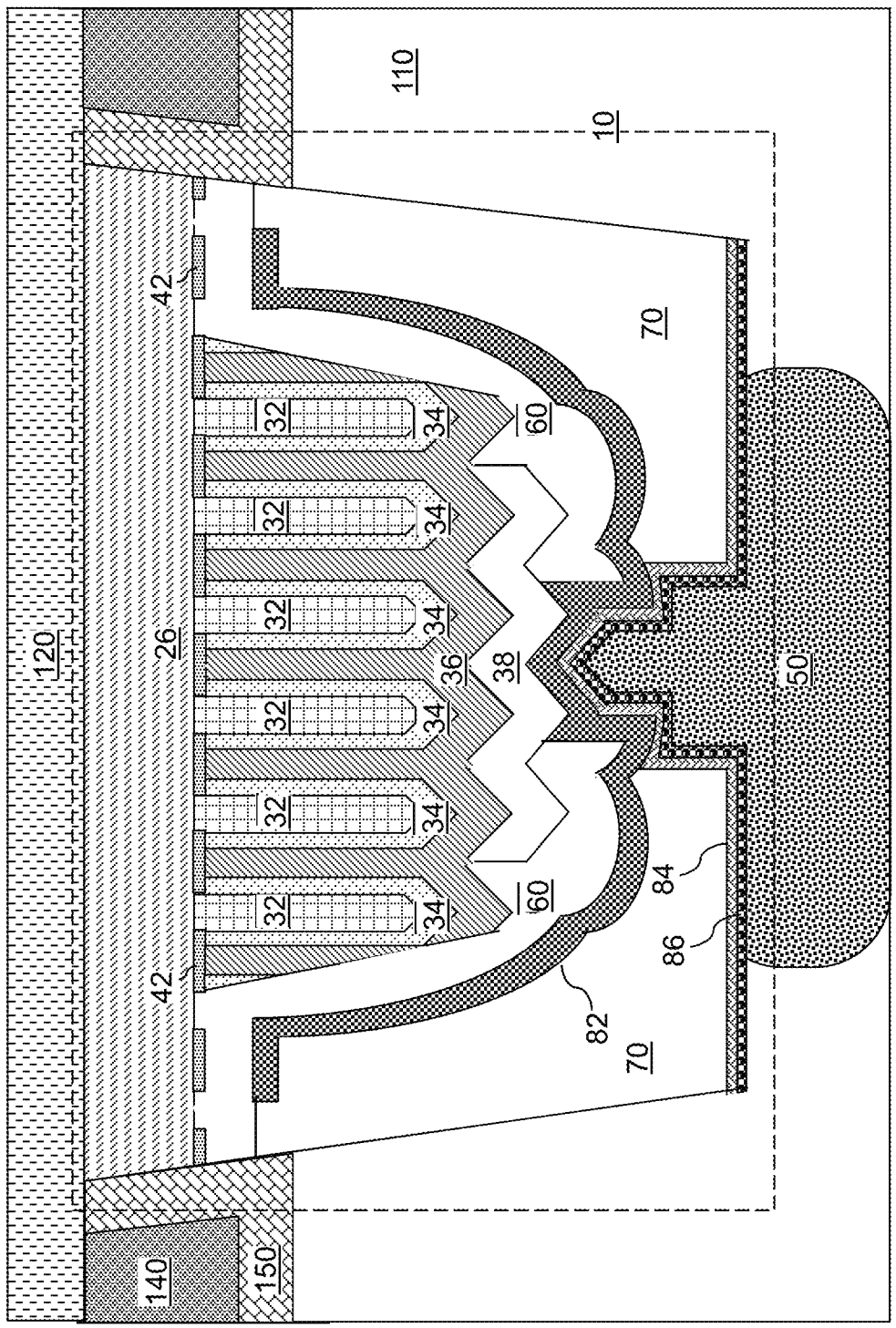
FIG. 14B is a magnified view of a region including a light emitting device within the structure of FIG. 14A.

Referring to FIGS. 14A and 14B, a fourth exemplary structure according to a fourth embodiment of the present disclosure can be derived from the third exemplary structure of FIG. 9 by depositing the material layer(s) of the light-absorptive conductive layer 140 directly on the top surface of the reflective metal layer 150. The recess depth for the dielectric matrix layer 110 at the processing steps of FIG. 8 is selected to be equal to, or less than the sum of all thicknesses of the optional conducive metallic liner 152, the reflective metal layer 150, and the material layer(s) of the light-absorptive conductive layer 140.

A planarization process such as chemical mechanical planarization can be performed to remove portions of the light-absorptive conductive layer 140, the reflective metal layer 150, and the optional conducive metallic liner 152 that overlie the top surfaces of the light emitting diodes 10. The planarized light-absorptive conductive layer 140 includes self-aligned openings therein. Each opening in the planarized light-absorptive conductive layer 140 is laterally offset from a periphery of a respective one of the light emitting diodes 10 by a uniform lateral offset distance. Each opening in the planarized reflective metal layer 150 is laterally offset from a periphery of a respective one of the light emitting diodes 10 by a thickness of the conductive metallic liner 152. Specifically, each opening in the layer stack of the patterned conductive metallic liner 152, the patterned reflective metal layer 150 and the light-absorptive conductive layer 140 coincides with an outer periphery of a respective one of the light emitting diodes 10. Thus, each light emitting diode 10 within the array of light emitting diodes 10 is located within an area of a respective opening through the patterned reflective metal layer 150 and the light-absorptive conductive layer 140.

Subsequently, a transparent conductive layer 120 can be formed directly on the physically exposed top surface of the light emitting diodes 10, the optional conducive metallic liner 152, the reflective metal layer 150, and the light-absorptive conductive layer 140. The composition and thickness of transparent conductive layer 120 can be the same as in the first embodiment. The transparent conductive layer 120 can function as a common bus electrode (such as a cathode) of the array of light emitting diodes 10 in conjunction with the optional conducive metallic liner 152, the reflective metal layer 150, and the light-absorptive conductive layer 140.

The patterned reflective metal layer 150 includes a planar portion having a uniform thickness and contacting the top surface of the dielectric matrix layer 110. The planar portion of the patterned reflective metal layer 150 can be vertically recessed from the top surfaces of the light emitting diodes 10. Thus, the planar portion of the patterned reflective metal layer 150 can have a top surface that is more proximal to the backplane 400 than the top surfaces of the light emitting diodes 10 is to the backplane 400. The planar portion of the patterned reflective metal layer 150 contacts the bottom surface of the light-absorptive conductive layer 140. The light-absorptive conductive layer 140 overlies the reflective metal layer 150, and comprises a planar portion having a uniform thickness and having a top surface that within a same two-dimensional plane as top surfaces of the light emitting diodes 10. The reflective metal layer 150 comprises annular portions contacting sidewalls of a respective one of the light emitting diodes 10 in the array of light emitting diodes 10, and having an annular top surface that is within a same plane as a two-dimensional plane including top surfaces of the light emitting diodes 10.

The layer stack of the patterned conductive metallic liner 152, the patterned reflective metal layer 150 and the light-absorptive conductive layer 140 is a patterned bus electrode layer including an array of self-aligned openings therein. The patterned bus electrode layer (152, 150, 140) is electrically shorted to the transparent conductive layer 120, and includes an array of openings therein. Each light emitting diode 10 within the array of light emitting diodes 10 is located within an area of a respective opening through the patterned bus electrode layer (152, 150, 140). In some embodiments, the light-absorptive conductive layer 140 can include at least one conductive material layer such as an optional conductive buffer layer 141, a metal layer (143 or 143), and a metallic light-absorptive layer 145 as described above. The light-absorptive conductive layer 140 can provide a higher light absorption than top surfaces of the light emitting diodes 10 as described above.

Figure 15:
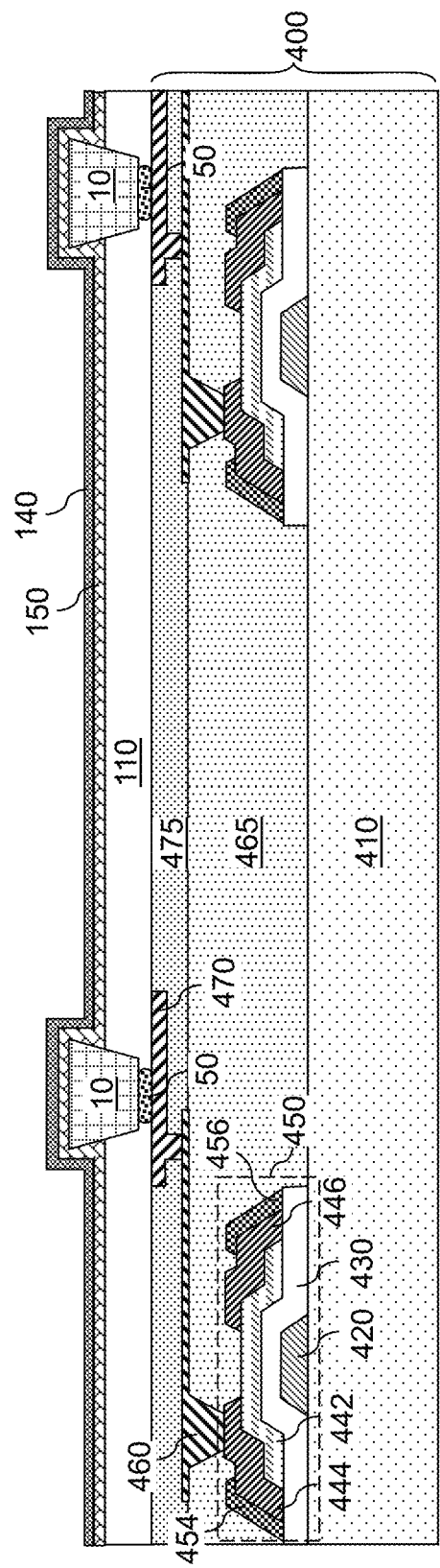
FIG. 15 is a vertical cross-sectional view of a fifth exemplary structure after formation of a stack of a reflective metal layer and a light-absorptive conductive layer according to a fourth embodiment of the present disclosure.

Referring to FIG. 15, a fifth exemplary structure can be derived from the fourth exemplary structure by selecting process parameters such that the recess depth of the dielectric matrix layer 110 at the processing steps of FIG. 8 is greater than the sum of all thicknesses of the optional conducive metallic liner 152, the reflective metal layer 150 and the material layer(s) of the light-absorptive conductive layer 140.

Figure 16A:
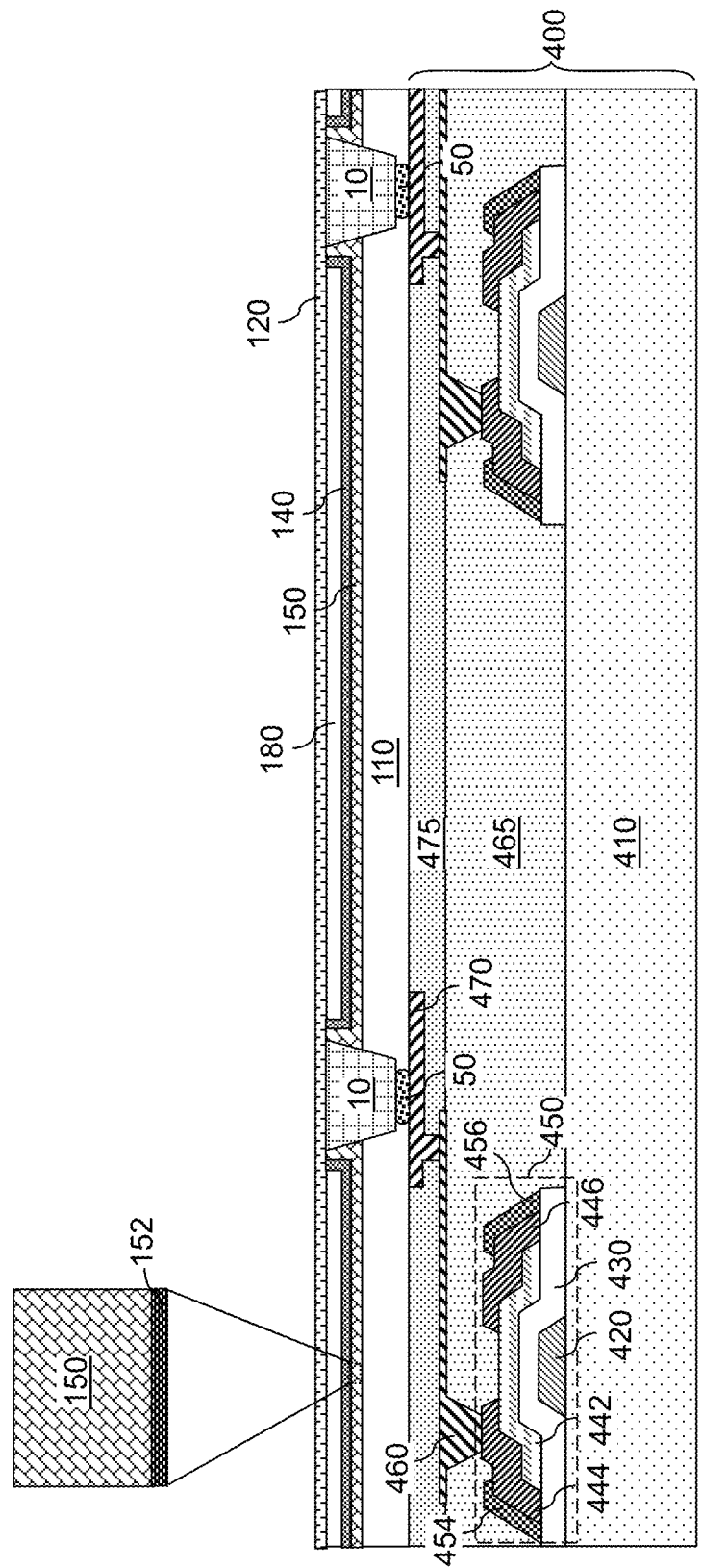
FIG. 16A is a vertical cross-sectional view of the fifth exemplary structure after formation of a transparent conducive layer according to the fifth embodiment of the present disclosure.
Figure 16B:
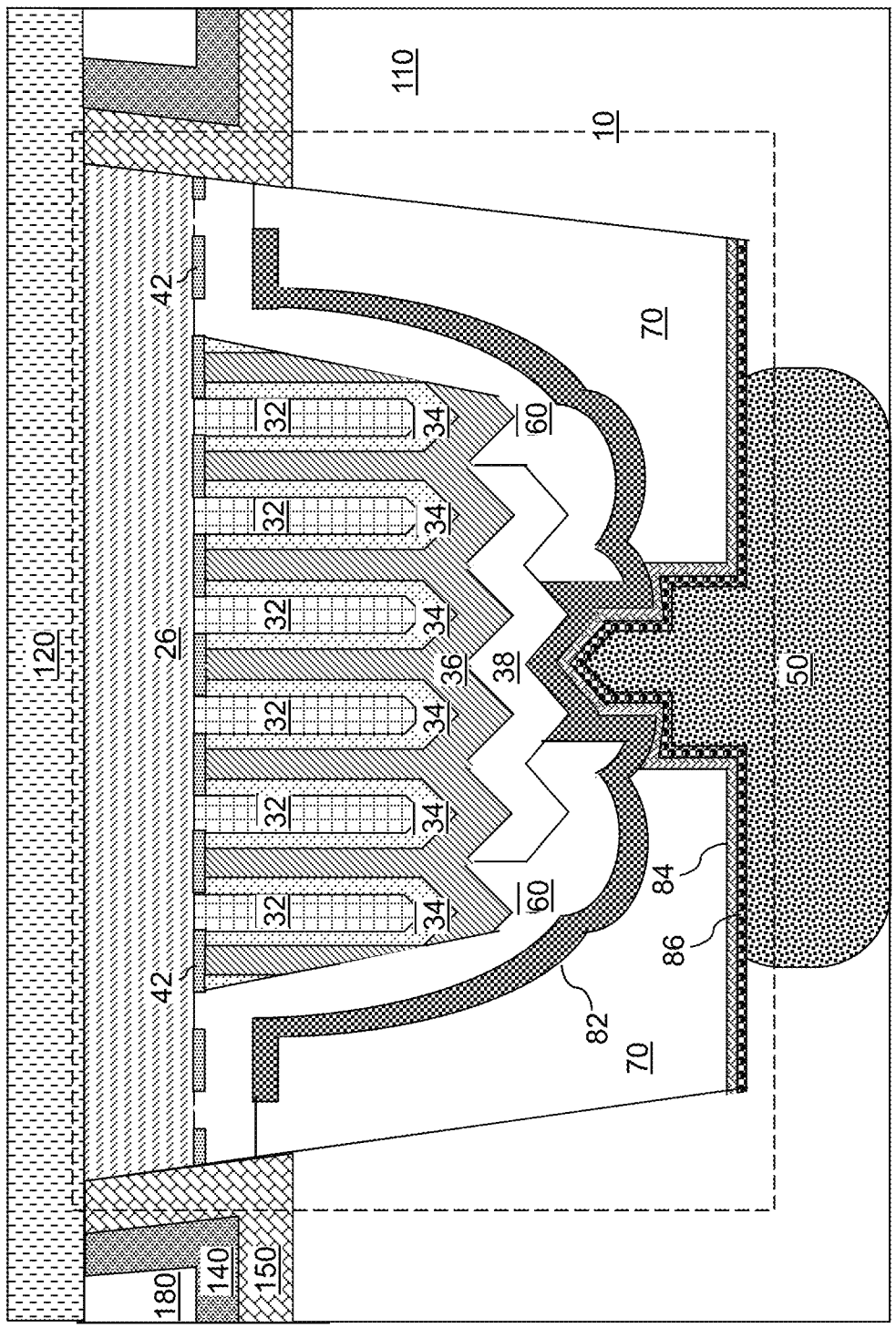
FIG. 16B is a magnified view of a region including a light emitting device within the structure of FIG. 16A.

Referring to FIGS. 16A and 16B, a planarizable dielectric fill material can be deposited over the light-absorptive conductive layer 140. The planarizable dielectric material can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition or plasma enhanced chemical vapor deposition).

A planarization process such as chemical mechanical planarization can be performed to remove portions of the planarizable dielectric material, the light-absorptive conductive layer 140, the reflective metal layer 150, and the conductive metallic liner 152 that overlie the top surfaces of the light emitting diodes 10. The remaining continuous portion of the planarizable dielectric material is herein referred to as a dielectric fill material layer 180. The dielectric fill material layer 180 embeds the array of light emitting diodes 10. The top surface of the dielectric fill material layer 180 can be coplanar with the top surfaces of the light emitting diodes 10. The dielectric fill material layer 180 is located on the front side of the backplane 400, laterally surrounds the array of light emitting diodes 10, and is more distal from the backplane 400 than the dielectric matrix layer 110 is from the backplane 400.

The planarized light-absorptive conductive layer 140 includes self-aligned openings therein. Each opening in the planarized light-absorptive conductive layer 140 is laterally offset from a periphery of a respective one of the light emitting diodes 10 by a uniform lateral offset distance. Each opening in the planarized reflective metal layer is laterally offset from a periphery of a respective one of the light emitting diodes 10 by a thickness of the conductive metallic liner 152. Specifically, each opening in the layer stack of the patterned conductive metallic liner 152, the patterned reflective metal layer 150 and the light-absorptive conductive layer 140 coincides with an outer periphery of a respective one of the light emitting diodes 10. Thus, each light emitting diode 10 within the array of light emitting diodes 10 is located within an area of a respective opening through the patterned reflective metal layer 150.

A transparent conductive layer 120 can be formed directly on the top surfaces, i.e., the front side surfaces, of the light emitting diodes 10, on the dielectric fill material layer 180, on an array of generally annular surfaces of the conductive metallic liner 152, on an array of generally annular surfaces of the reflective metal layer, and on an array of generally annular surfaces of the light-absorptive conductive layer 140. The composition and thickness of transparent conductive layer 120 can be the same as in the first embodiment. The transparent conductive layer 120 can function as a common electrode (such as a cathode) of the array of light emitting diodes 10 in conjunction with the reflective metal layer 150.

The patterned reflective metal layer 150 includes a planar portion having a uniform thickness and contacting the top surface of the dielectric matrix layer 110. The planar portion of the patterned reflective metal layer 150 can be vertically recessed from the top surfaces of the light emitting diodes 10. Thus, the planar portion of the patterned reflective metal layer 150 can have a top surface that is more proximal to the backplane 400 than the top surfaces of the light emitting diodes 10 is to the backplane 400. The planar portion of the patterned reflective metal layer 150 contacts the bottom surface of the light-absorptive conductive layer 140. The reflective metal layer 150 comprises annular portions contacting sidewalls of a respective one of the light emitting diodes 10 in the array of light emitting diodes 10, and having an annular top surface that is within a same plane as a two-dimensional plane including top surfaces of the light emitting diodes 10.

The light-absorptive conductive layer 140 includes a planar portion having a uniform thickness and contacting the top surface of the planar portion of the reflective metal layer 150. The planar portion of the light-absorptive conductive layer 140 can be vertically recessed from the top surfaces of the light emitting diodes 10. Thus, the planar portion of the light-absorptive conductive layer 140 can have a top surface that is more proximal to the backplane 400 than the top surfaces of the light emitting diodes 10 is to the backplane 400. The planar portion of the light-absorptive conductive layer 140 contacts the bottom surface of the dielectric fill material layer 180.

The dielectric fill material layer 180 overlies the light-absorptive conductive layer 140, and comprises a planar portion having a uniform thickness and having a top surface that within a same two-dimensional plane as top surfaces of the light emitting diodes 10. The dielectric fill material layer 180 overlies the planar portion of the reflective metal layer 150, is laterally bounded by the annular portions of the reflective metal layer 150, and contacts a bottom surface of the transparent conducive layer 120.

The layer stack of the patterned conductive metallic liner 152, the patterned reflective metal layer 150 and the light-absorptive conductive layer 140 is a patterned bus electrode layer including an array of self-aligned openings therein. The patterned bus electrode layer (152, 150, 140) is electrically shorted to the transparent conductive layer 120, and includes an array of openings therein. Each light emitting diode 10 within the array of light emitting diodes 10 is located within an area of a respective opening through the patterned bus electrode layer (152, 150, 140). In some embodiments, the light-absorptive conductive layer 140 can include at least one conductive material layer such as an optional conductive buffer layer 141, a metal layer (143 or 143), and a metallic light-absorptive layer 145 as described above. The light-absorptive conductive layer 140 can provide a higher light absorption than top surfaces of the light emitting diodes 10 as described above.

Figure 17A:
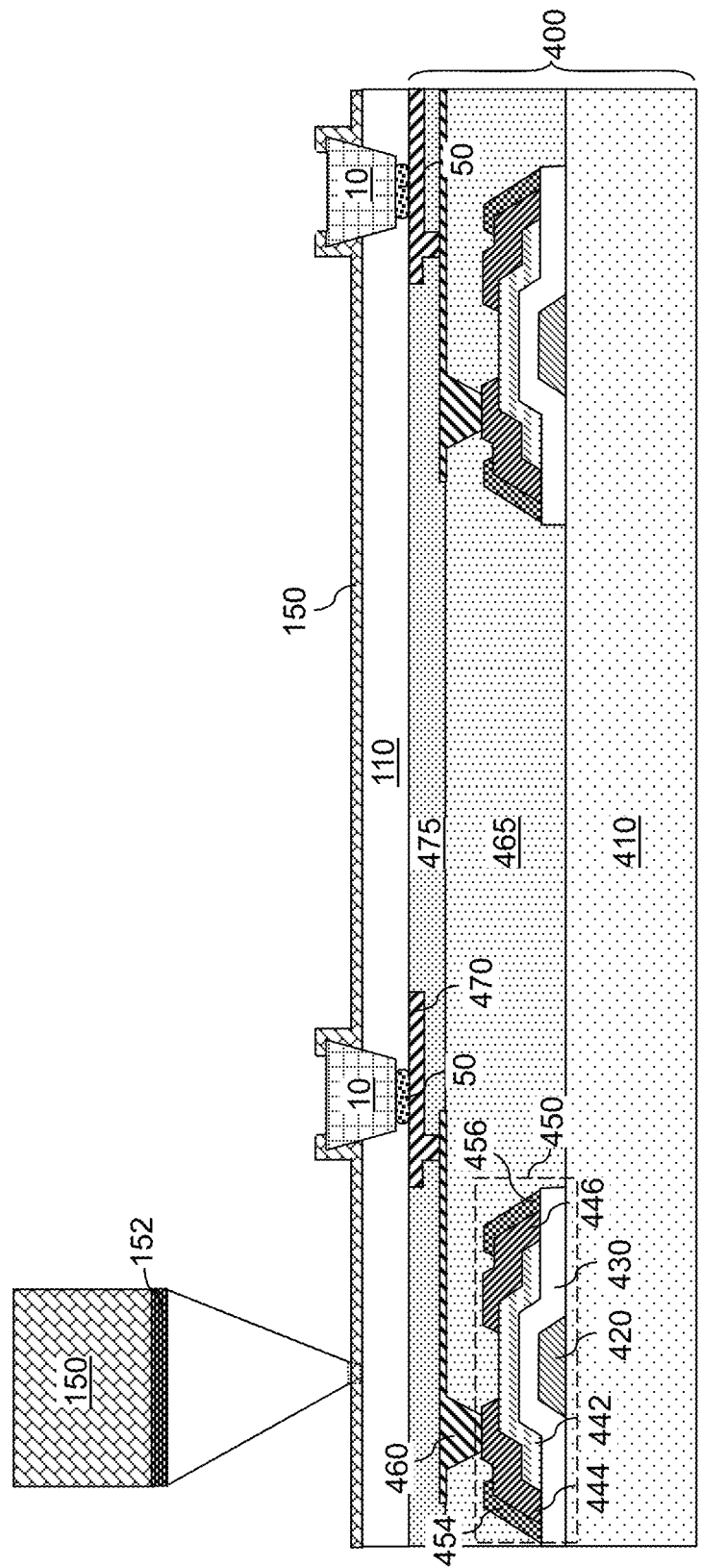
FIG. 17A is a vertical cross-sectional view of a sixth exemplary structure after formation of a patterned reflective metal layer according to a sixth embodiment of the present disclosure.
Figure 17B:
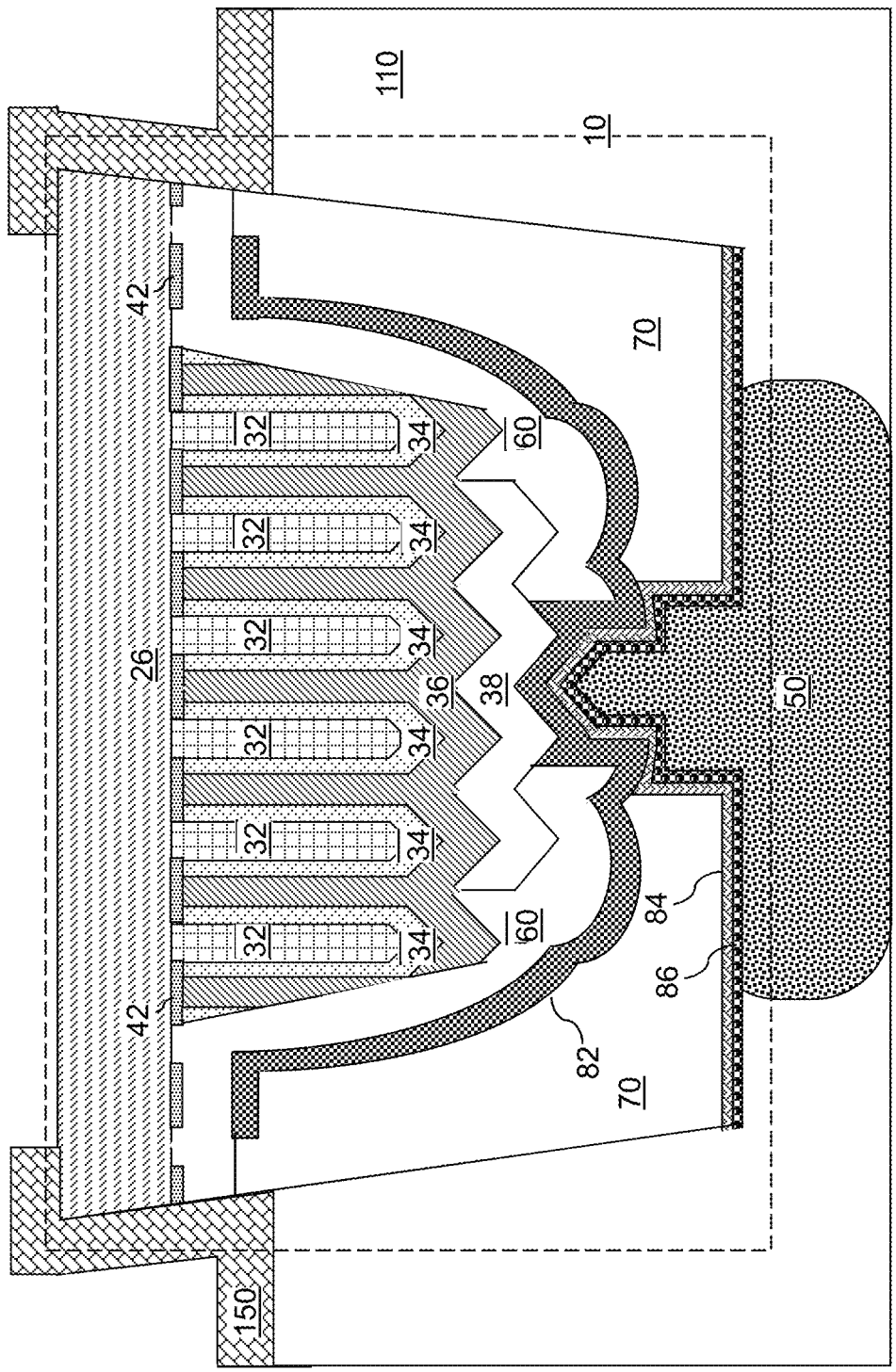
FIG. 17B is a magnified view of a region including a light emitting device within the structure of FIG. 17A.

Referring to FIGS. 17A and 17B, a sixth exemplary structure according to a sixth embodiment of the present disclosure can be derived from the third exemplary structure illustrated in FIG. 9 by patterning the reflective metal layer 150 and the conducive metallic liner 152. For example, a photoresist layer can be applied over the reflective metal layer 150, and can be lithographically patterned by lithographic exposure and development. An etch process can be performed to etch the material of the reflective metal layer 150 and the conducive metallic liner 152 employing the patterned photoresist layer as an etch mask. An isotropic etch process or an anisotropic etch process can be employed. The etch process can be selective to the material of the doped compound semiconductor material layer 26. The photoresist layer can be subsequently removed, for example, by ashing. Portions of the patterned reflective metal layer 150 remain on the edge of the top surface of the light emitting diodes 10. However, the center of the top surface of the light emitting diodes 10 is exposed in the opening in the patterned reflective metal layer 150 to contact the transparent conductive layer 120.

The patterned reflective metal layer 150 and the optional conductive metallic liner 152 constitute a patterned bus electrode layer (150, 152) that is electrically shorted to the transparent conductive layer 120. The patterned bus electrode layer (150, 152) includes an array of openings therein such that each light emitting diode 10 within the array of light emitting diodes 10 is located within an area of a respective opening through the patterned bus electrode layer (150, 152). The reflective metal layer 150 includes a metallic material that reflects more than 50%, and/or as more than 80%, and/or more than 90%, of visible light. For example, the reflective metal layer 150 includes a reflective metal such as gold, silver, copper, or aluminum. The thickness of the reflective metal layer 150 can be in a range from 300 nm to 3 microns, although lesser and greater thicknesses can also be employed.

The light emitting device according to the sixth embodiment of the present disclosure can include a backplane 400, an array of light emitting diodes 10 attached to a front side of the backplane 400, a dielectric matrix layer 110 located on the front side of the backplane 400 and laterally surrounding the array of light emitting diodes 10; and a reflective metal layer 150 reflecting more than 50%, and/or as more than 80%, and/or more than 90%, of visible light including an array of openings therein. In one embodiment, a transparent passivation layer such as a silicon nitride layer or a silicon oxide layer may be conformally formed directly on the top surfaces of the light emitting diodes 10 and the top surfaces and sidewalls of the reflective metal layer 150. Alternatively, the top of each of the light emitting diodes 10 may be physically exposed to an oxidizing ambient to provide passivated oxidized surfaces of the doped compound semiconductor material layers 26 that are self-aligned to sidewalls of openings in the reflective metal layer 150.

The various exemplary structures of the present disclosure prevent emission of light, partly or completely, from areas between neighboring pairs of light emitting diodes 10, and thus enhances the sharpness of images formed by the array of light emitting diodes 10. Embodiments that employ a light-absorptive layer provide a darker non-reflective background surface for the array of light emitting diodes, thereby enhancing the contrast of the images formed by the array of light emitting diodes 10. Further, embodiments employing a patterned reflective metal layer 150 provide light reflection off sidewalls of annular portions of the reflective metal layer 150 that laterally surround the upper portions of the light emitting diodes 10, thereby increasing the light output from each light emitting diode 10. Thus, the various embodiments of the present disclosure can be advantageously employed to provide image enhancement in a light emitting device, such as a direct view display device in which the LED 10 light is directly viewed by a human observer without an intervening liquid crystal layer.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device comprising:
 a backplane;
 an array of light emitting diodes attached to a front side of the backplane through an array of solder balls, each solder ball within the array of solder balls being bonded to a device-side bonding pad located on a respective light emitting diode within the array of light emitting diodes and to a respective bond pad located on the backplane;
 a dielectric matrix layer located on, and contacting, the front side of the backplane and laterally surrounding the array of light emitting diodes and contacting the array of solder balls;
 a transparent conductive layer contacting front side surfaces of the light emitting diodes; and
 a patterned bus electrode layer electrically shorted to the transparent conductive layer and including an array of openings therein, wherein each light emitting diode within the array of light emitting diodes is located within an area of a respective opening through the patterned bus electrode layer.

2. The light emitting device of claim 1, wherein the patterned bus electrode layer comprises at least one light-absorptive electrically conductive layer which provides a higher light absorption than the transparent conductive layer.

3. The light emitting device of claim 2, wherein the at least one light-absorptive electrically conductive layer comprises at least one metal layer and at least one dielectric material layer that provides higher light absorption of visible light than the at least one metal.

4. The light emitting device of claim 3, wherein the at least one dielectric material layer comprises a metal oxide material embedded in a resin.

5. The light emitting device of claim 3, wherein the at least one dielectric material layer comprises a phase matching dielectric layer that induces destructive interference of incoming light along a direction normal to the front surface of the backplane.

6. The light emitting device of claim 2, wherein the at least one light-absorptive electrically conductive layer comprises a stack of:
a metal layer; and
a light-absorptive layer comprising a material having a higher visible light absorptivity than the metal layer.

7. The light emitting device of claim 6, wherein the at least one light-absorptive electrically conductive layer is selected from:
a stack of a copper layer and a chromium layer;
a stack of a first chromium layer, a copper layer, and a second chromium layer;
a stack of a gold layer and a chromium layer;
a stack of an aluminum layer and a chromium layer; and
a stack of an aluminum layer and a molybdenum layer.

8. The light emitting device of claim 2, wherein the at least one light-absorptive electrically conductive layer absorbs more than 90% of visible light.

9. The light emitting device of claim 1, wherein the patterned bus electrode layer comprises a reflective metal layer reflecting more than 50% of visible light.

10. The light emitting device of claim 9, wherein the reflective metal layer comprises a planar portion having a uniform thickness and having a top surface that is more proximal to the backplane than top surfaces of the light emitting diodes in the array are to the backplane.

11. The light emitting device of claim 9, wherein a bottom surface of the transparent conductive layer contacts an array of annular top surfaces of the reflective metal layer.

12. The light emitting device of claim 1, wherein the patterned bus electrode layer has a higher electrical conductivity than the transparent conductive layer.

13. The light emitting device of claim 1, wherein the patterned bus electrode layer is located on a front side surface of the transparent conductive layer.

14. The light emitting device of claim 1, wherein the patterned bus electrode layer is located on a backside surface of the transparent conductive layer.

15. The light emitting device of claim 1, wherein a top surface of the dielectric matrix layer is coplanar with top surfaces of the light emitting diodes.

16. The light emitting device of claim 1, wherein:
the transparent conductive layer comprises a material selected from indium tin oxide and aluminum doped zinc oxide; and
the dielectric matrix layer comprises a planarizable dielectric material selected from undoped silicate glass, a doped silicate glass, a flowable oxide (FOX), silicone, and resin.

17. A method of forming a light emitting device, comprising:
bonding an array of light emitting diodes to a front side of a backplane through an array of solder balls, each solder ball within the array of solder balls being bonded to a device-side bonding pad located on a respective light emitting diode within the array of light emitting diodes and to a respective bond pad located on the backplane;
forming a dielectric matrix layer directly on the front side of the backplane around the array of light emitting diodes and directly on the array of solder balls; and
forming a combination of a transparent conductive layer and a patterned bus electrode layer over the dielectric matrix layer,
wherein:
the transparent conductive layer is formed directly on a front side surface of light emitting diodes within the array of light emitting diodes;
the patterned bus electrode layer is electrically shorted to the transparent conductive layer and includes an array of openings therein; and
each light emitting diode within the array of light emitting diodes is located within an area of a respective opening through the patterned bus electrode layer.

18. The method of claim 17, wherein the patterned bus electrode layer comprises at least one light-absorptive electrically conductive layer providing a higher light absorption than the transparent conductive layer.

19. The method of claim 17, further comprising planarizing the dielectric matrix layer, wherein a top surface of the dielectric matrix layer is coplanar with top surfaces of the light emitting diodes.

20. The method of claim 17, wherein:
the transparent conductive layer comprises a material selected from indium tin oxide and aluminum doped zinc oxide;
the dielectric matrix layer comprises a planarizable dielectric material selected from undoped silicate glass, a doped silicate glass, a flowable oxide (FOX), silicone, and resin; and
the dielectric matrix layer is planarized by chemical mechanical planarization.

* * * * *